(12) United States Patent
Nakamura et al.

(10) Patent No.: US 11,913,813 B2
(45) Date of Patent: Feb. 27, 2024

(54) POWER GENERATION ELEMENT, MAGNETIC SENSOR, ENCODER, AND MOTOR

(71) Applicant: Mitsubishi Electric Corporation, Tokyo (JP)

(72) Inventors: Yoshitomo Nakamura, Tokyo (JP); Yoshinori Miyamoto, Tokyo (JP); Shinichiro Yoshida, Tokyo (JP); Hisanori Torii, Tokyo (JP); Takeshi Musha, Tokyo (JP); Masanori Nimura, Tokyo (JP); Shizuka Ueda, Tokyo (JP); Takuya Noguchi, Tokyo (JP); Toshio Mekata, Tokyo (JP); Yuji Kubo, Tokyo (JP); Hitoshi Hasegawa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 18/270,239

(22) PCT Filed: Dec. 27, 2021

(86) PCT No.: PCT/JP2021/048657
§ 371 (c)(1),
(2) Date: Jun. 29, 2023

(87) PCT Pub. No.: WO2022/153861
PCT Pub. Date: Jul. 21, 2022

(65) Prior Publication Data
US 2023/0392962 A1 Dec. 7, 2023

(30) Foreign Application Priority Data

Jan. 12, 2021 (WO) .................. PCT/JP2021/000651

(51) Int. Cl.
*G01D 5/245* (2006.01)
*G01R 33/02* (2006.01)
*H10N 50/10* (2023.01)

(52) U.S. Cl.
CPC ............. *G01D 5/245* (2013.01); *G01R 33/02* (2013.01); *H10N 50/10* (2023.02)

(58) Field of Classification Search
CPC ...... G01D 5/12; G01D 5/14–16; G01D 5/244; G01D 5/245; G01R 33/02; G01R 33/0206; G01R 33/06–098
See application file for complete search history.

(56) References Cited

U.S. PATENT DOCUMENTS

| 4,374,403 A | 2/1983 | Oshima et al. |
| 6,259,248 B1 | 7/2001 | Gotoh et al. |
| (Continued) | | |

FOREIGN PATENT DOCUMENTS

| JP | S56-007221 A | 1/1981 |
| JP | S56-34129 A | 4/1981 |
| (Continued) | | |

OTHER PUBLICATIONS

International Search Report and Written Opinion dated Mar. 22, 2022, received for PCT Application PCT/JP2021/048657, filed on Dec. 27, 2021, 13 pages including English Translation.

(Continued)

*Primary Examiner* — Huy Q Phan
*Assistant Examiner* — David B Frederiksen
(74) *Attorney, Agent, or Firm* — XSENSUS LLP

(57) ABSTRACT

A power generation element includes a magnetic member that produces a large Barkhausen effect and magnetism collection members including an insertion part having the magnetic member inserted therethrough. The magnetism collection member includes a first component on an opposite (Continued)

side of a boundary plane to a magnetic field generation unit and a second component on the same side of the boundary plane as the magnetic field generation unit, the boundary plane passing through a center of an imaginary circle inscribed in the insertion part and having a diameter equal to a length of the insertion part in a third direction perpendicular to first and second directions, the first direction is a direction of the insertion of the magnetic member, and the second direction is a direction in which the magnetic field generation unit is disposed. A volume of the second component is larger than a volume of the first component.

19 Claims, 23 Drawing Sheets

(56) References Cited

U.S. PATENT DOCUMENTS

| | | | |
|---|---|---|---|
| 9,494,556 | B2* | 11/2016 | May .................. G01L 1/12 |
| 2010/0156406 | A1* | 6/2010 | Ueda .................. G01N 27/745 |
| | | | 324/258 |
| 2015/0338245 | A1 | 11/2015 | Tatei et al. |
| 2017/0276820 | A1* | 9/2017 | Adachi .................. G01V 3/104 |
| 2019/0148043 | A1 | 5/2019 | Theil et al. |
| 2021/0109122 | A1 | 4/2021 | Mitsuhashi et al. |
| 2023/0068474 | A1 | 3/2023 | Nakamura et al. |

FOREIGN PATENT DOCUMENTS

| | | | |
|---|---|---|---|
| JP | S61-184325 | U | 11/1986 |
| JP | S62-264078 | A | 11/1987 |
| JP | H11-97986 | A | 4/1999 |
| JP | 2006-073974 | A | 3/2006 |
| JP | 2011-089916 | A | 5/2011 |
| JP | 2016-144335 | A | 8/2016 |
| JP | 2018-132432 | A | 8/2018 |
| JP | 2019-132699 | A | 8/2019 |
| JP | 2020-190430 | A | 11/2020 |
| WO | 2014/128937 | A1 | 8/2014 |
| WO | 2018/173106 | A1 | 9/2018 |
| WO | 2019/188859 | A1 | 10/2019 |
| WO | 2021/200361 | A1 | 10/2021 |

OTHER PUBLICATIONS

Decision to Grant dated Jun. 21, 2022, received for JP Application 2022-532154, 5 pages including English Translation.

Notice of Opposition with Grounds dated Apr. 3, 2023 in corresponding Japanese Patent Application No. 2022-532154, 74 pages.

Notice of Reasons for Revocation dated Jun. 2, 2023 in corresponding Japanese Patent Application No. 2022-532154 with machine English translation thereof, 75 pages.

* cited by examiner

POWER GENERATION ELEMENT, MAGNETIC SENSOR, ENCODER, AND MOTOR

CROSS-REFERENCE TO RELATED APPLICATIONS

The present application is based on PCT filing PCT/JP2021/048657, filed Dec. 27, 2021, which claims priority from International Patent Application No. PCT/JP2021/000651, filed Jan. 12, 2021, the entire contents of each are incorporated herein by reference.

FIELD

The present disclosure relates to a power generation element for generating an electromotive force in a coil by reversing a magnetization direction of a magnetic body, and to a magnetic sensor, an encoder, and a motor.

BACKGROUND

A large Barkhausen effect is a phenomenon in which a magnetization direction is rapidly reversed according to a change in an external magnetic field. A known power generation element includes a magnetic member made of a magnetic material that produces the large Barkhausen effect, and a power generation coil made of a conductive wire around the magnetic member. This power generation element generates an electromotive force in the power generation coil by electromagnetic induction when the magnetization direction of the magnetic member is reversed by the large Barkhausen effect with a magnetic field generation unit applying an external magnetic field to the magnetic member.

In a case where a magnet having two or more poles is used as the magnetic field generation unit, a rotational phase of the magnet at which phase to produce the large Barkhausen effect when the magnet is rotated varies depending on the direction of rotation of the magnet, which results in a difference in the rotational phase. Further, when the power generation element is disposed at a position shifted in a radial direction from a rotation center of the magnet, the external magnetic field of the magnet is weaker at the position where the power generation element is disposed than at the rotation center of the magnet. In this case, a change in the external magnetic field of the magnet applied to the magnetic member is gentle with respect to the rotational phase of the magnet. For this reason, depending on the rotation direction of the magnet, a phase difference in the rotational phase of the magnet at which phase to produce the large Barkhausen effect also increases. That is, the phase difference in the rotational phase of the magnet that generates the electromotive force in the power generation coil also increases. In order to reduce the phase difference in the rotational phase of the magnet that generates the electromotive force in the power generation coil, therefore, a technique of increasing the external magnetic field applied to the magnetic member is required.

Patent Literature 1 discloses a magnetic structure having a cylindrical soft magnetic body disposed at each of opposite end portions of a magnetic member to reduce a diamagnetic field generated at a terminal end of a magnetic member and hence improve the uniformity of a magnetic flux generated in the magnetic member. By applying the magnetic structure described in Patent Literature 1 to a power generation element, it becomes possible to stably generate the large Barkhausen effect in the magnetic member without depending on strength and a polarity of the external magnetic field, which will reduce fluctuation of the power generation characteristics.

CITATION LIST

Patent Literature

Patent Literature 1: Japanese Patent Application Laid-open No. 2006-73974

SUMMARY

Technical Problem

In a case where the magnetic structure described in Patent Literature 1 is applied to a power generation element, it is expected that simply increasing a size of the cylindrical soft magnetic body increases an external magnetic field applied to the magnetic member. However, it is necessary to consider downsizing the power generation element as a device such as an encoder to which the power generation element is applied needs downsizing. That is, the method of simply increasing the size of the cylindrical soft magnetic body in the magnetic structure described in Patent Literature 1 poses a problem of failure to meet the demand for downsizing of the device and the power generation element.

The present disclosure has been made in view of the above, and an object thereof is to obtain a power generation element capable of increasing an external magnetic field applied to a magnetic member as well as preventing an increase in size as compared with a conventional one.

Solution to Problem

In order to solve the above-described problem and achieve the object, a power generation element of the present disclosure comprises: a magnetic member made of a magnetic material to produce a large Barkhausen effect; a power generation coil to interlink with a magnetic flux passing through the magnetic member; and two magnetism collection members containing a soft magnetic material and each including an insertion part having the magnetic member inserted therethrough, the magnetism collection members being provided at opposite end portions of the magnetic member in contact with the magnetic member with the magnetic member inserted through the insertion parts. The magnetism collection member includes a first component on an opposite side of a boundary plane to a magnetic field generation unit and a second component on the same side of the boundary plane as the magnetic field generation unit, the boundary plane being defined as an imaginary plane passing through a center of an imaginary inscribed circle, the imaginary inscribed circle being inscribed in the insertion part and having a diameter equal to a length of the insertion part in a third direction, the third direction being a direction perpendicular to both a first direction and a second direction, the imaginary plane being parallel to an imaginary plane having a normal vector defined by the second direction, the first direction being a direction in which the magnetic member is inserted in the insertion part, the second direction being a direction in which the magnetic field generation unit to apply a magnetic field to the magnetic member is disposed as viewed from the magnetism collection member. A volume of the second component is larger than a volume of the first component.

Advantageous Effects of Invention

The power generation element according to the present disclosure has an effect of increasing an external magnetic field applied to a magnetic member as well as preventing an increase in size as compared with the related art.

DESCRIPTION OF EMBODIMENTS

Hereinafter, a power generation element, a magnetic sensor, an encoder, and a motor according to embodiments of the present disclosure will be described in detail with reference to the drawings.

First Embodiment

<Configuration of Power Generation Element>

Figure 1:
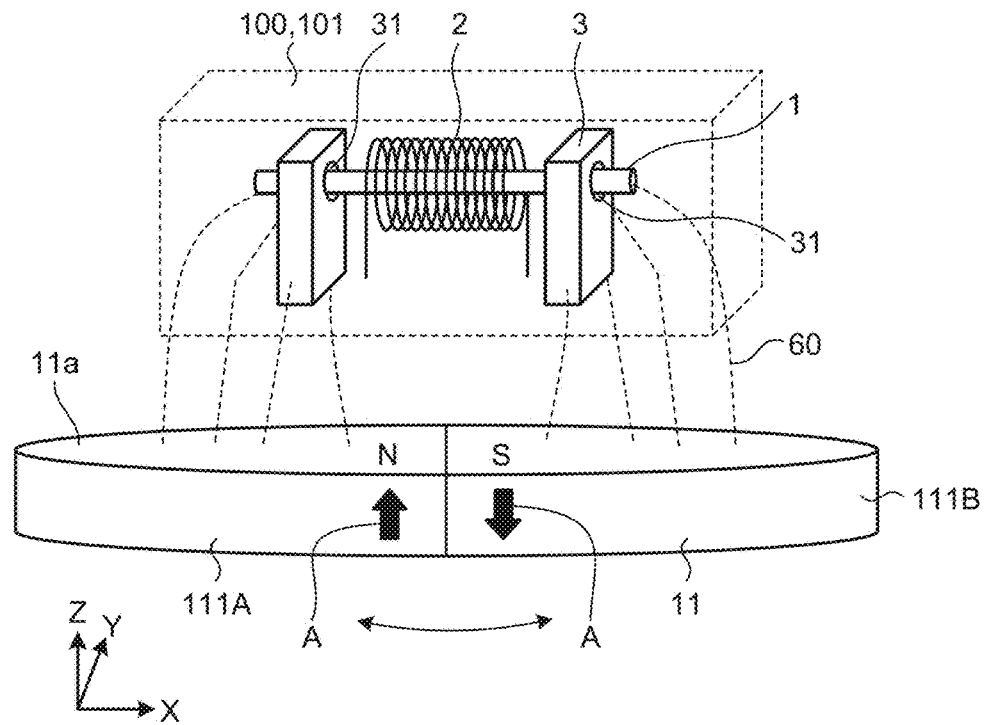
FIG. 1 is a perspective view illustrating an example of a configuration of a power generation element according to a first embodiment.

FIG. 1 is a perspective view illustrating an example of a configuration of a power generation element according to a first embodiment. In FIG. 1, a direction toward a magnetic field generation unit 11 as viewed from a magnetism collection member 3 is defined as a Z axis, and two directions orthogonal to each other in a plane perpendicular to the Z axis are defined as an X axis and a Y axis. A direction from the magnetic field generation unit 11 toward a power generation element 100 is a positive direction of the Z axis. The X axis corresponds to a direction of extension of a magnetic member 1. Further, an X-axis direction corresponds to a first direction, a Z-axis direction corresponds to a second direction, and a Y-direction corresponds to a third direction. Note that, in FIG. 1, the magnetic field generation unit 11 that applies an external magnetic field 60 to the power generation element 100 is also illustrated together with the power generation element 100.

The power generation element 100 includes one or more unit structure parts 101 including the magnetic member 1, a power generation coil 2, and the magnetism collection member 3. That is, the unit structure part 101 defines one set including the magnetic member 1, the power generation coil 2, and the two magnetism collection members 3. The power generation element 100 can include one or more unit structure parts 101, but an example discussed herein is where the power generation element 100 includes one unit structure part 101. The magnetic member 1 is made of a magnetic material. That is, the magnetic member 1 is defined by a magnetic body that produces a large Barkhausen effect by a change in the external magnetic field 60. The large Barkhausen effect is a phenomenon in which, when the magnetic member 1 is magnetized, a magnetic domain wall inside the magnetic member 1 moves at a time, so that a magnetization direction is reversed in an extremely short time. In the example of FIG. 1, the magnetic member 1 is a magnetic material having a linear shape extending in one direction. The linear shape includes a rod shape and a wire shape.

In order to produce the large Barkhausen effect on the magnetic member, the magnetic member 1 should have an internal stress distribution and a composition distribution that are controlled such that the magnetic member 1 has different coercive forces between its outer peripheral and center portions in a cross section perpendicular to the extending direction of the magnetic member 1. In one example, the magnetic member 1 is made of a material in which the coercive force of the outer peripheral portion of the magnetic member 1 is smaller than that of the center portion of the magnetic member 1. As such a magnetic member 1, a vicalloy alloy (FeCoV alloy), a permalloy alloy (NiFe alloy), an amorphous alloy, or the like can be used. Further, in order to control the coercive force, these alloy materials are subjected to wire drawing work, twisting work, bending work, surface treatment, and the like. Examples of the surface treatment include heat treatment, plating treatment, and chemical treatment. In addition, additives may be added to these alloy materials to control the coercive force.

In one example, vicalloy alloy is subjected to wire drawing and subsequently twisted to thereby provide the magnetic member 1 having the coercive force different between the outer peripheral portion and the center portion. The illustrated cross-sectional shape perpendicular to the direction of extension of the magnetic member 1 is circular, but the cross-sectional shape is not limited thereto. In one example, the cross-sectional shape perpendicular to the extending direction of the magnetic member 1 may be an elliptical shape or a polygonal shape such as a quadrangle. In addition, a description will be given assuming that the magnetic member 1 is between 0.1 mm and 1 mm, inclusive in diameter, and 10 mm and 13 mm, inclusive in length, but this is an example, and the diameter and the length, of the magnetic member 1 are not limited.

The power generation coil 2, which is a coil made of a conductive wire wound around the magnetic member 1, interlinks with a magnetic flux passing through the magnetic member 1. When the magnetic flux changes due to reversal of magnetization in the magnetic member 1 as a result of the large Barkhausen effect, an electromotive force due to electromagnetic induction is generated at opposite ends of the power generation coil 2. The electromotive force generated in the power generation coil 2 is extracted to the outside and used. In the example of FIG. 1, the magnetic member 1 is disposed inside the power generation coil 2. A conductive wire with an insulating coating, such as a copper wire, an aluminum wire, a gold wire, a silver wire, a copper alloy wire, or an aluminum alloy wire can be used as the power generation coil 2. A diameter of the conductive wire is selected on the basis of a diameter of the magnetic member 1 for the wire to be wound therearound, a size of the power generation element 100, etc. In one example, a conductive wire with an insulating coating is wound on a bobbin to thereby form the power generation coil 2. Further, in another example, a conductive wire is wound on a jig/tool and secured using an adhesive and a self-fusion wire, after which the conductive wire is removed from the jig/tool to thereby form the power generation coil 2. A description will be given taking an example in which the power generation coil 2 is a conductive wire having a diameter between 0.02 mm and 0.05 mm, inclusive, but, the diameter of the power generation coil 2 is not limited.

The magnetism collection member 3 has an insertion part 31 through which the magnetic member 1 is inserted. The magnetism collection member 3 is provided at each end portion of the magnetic member 1 such that the magnetic member 1 contacts the inside of the insertion part 31. In other words, the magnetism collection member 3 contacts the magnetic member 1 with the magnetic member 1 inserted through the insertion part 31. The magnetism collection member 3 is a block-shaped member containing a soft magnetic material. The magnetism collection member 3 is made of soft magnetic material. The soft magnetic material easily causes reversal of magnetic poles, for example, and has a coercive force lower than that of the magnetic member 1. In addition, the magnetism collection member 3 is desirably made of a material having higher magnetic permeability and higher saturation magnetic flux density than those of the magnetic member 1. In the first embodiment, the magnetism collection member 3 is disposed in such a manner as to cover a periphery of a plane parallel to the direction of extension of the magnetic member 1 at each end portion of the magnetic member 1. The magnetism collection member 3 has a magnetism collecting effect of collecting the magnetic flux from the magnetic field generation unit 11.

As described above, the magnetism collection member 3 is any soft magnetic material having a lower coercive force than that of the magnetic member 1. The soft magnetic material is a material selected from a group consisting of soft ferrite, permalloy, permendur, silicon steel, amorphous magnetic alloy, nanocrystal magnetic alloy, and sendust. In addition, the material used for the magnetism collection member 3 is desirably an inexpensive material that can be accurately machined into a target shape. Examples of such a material used for the magnetism collection member 3 include a cold-rolled steel plate. Furthermore, the magnetism collection member 3 may be a plastic material, etc. containing a soft magnetic material machined into particles. The magnetism collection member 3 using this plastic material can be easily molded into various shapes through injection molding etc.

Figure 2:
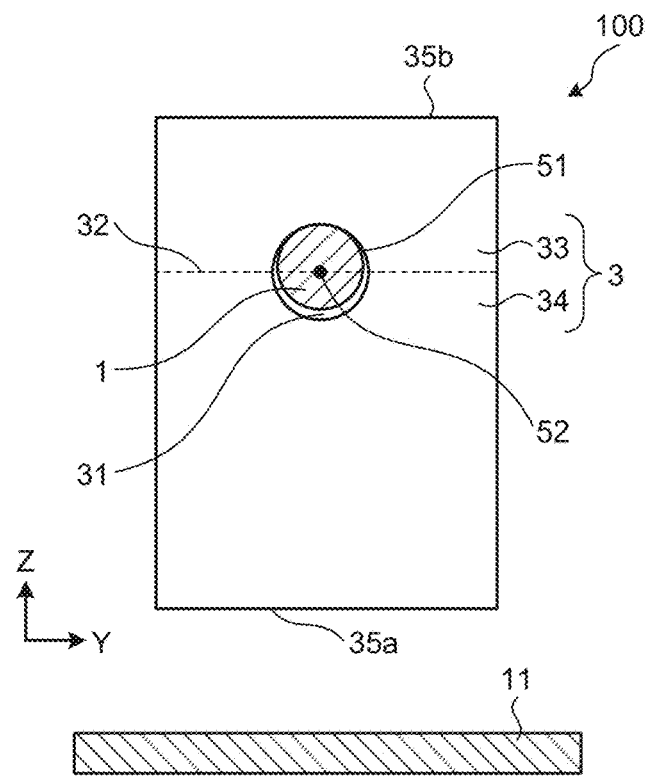
FIG. 2 is a cross-sectional view illustrating an example of a configuration of the power generation element according to the first embodiment.

FIG. 2 is a cross-sectional view illustrating an example of a configuration of the power generation element according to the first embodiment. FIG. 2 illustrates a cross section of the power generation element 100 taken at a position of the magnetism collection member 3 perpendicularly to the direction of extension of the magnetic member 1. In FIG. 2, hatching of the magnetism collection member 3 is omitted for easy understanding of the description. The magnetism collection member 3 has the insertion part 31 through which the magnetic member 1 is inserted. In the first embodiment, the insertion part 31 is a hole extending through the magnetism collection member 3 in a thickness direction. The hole defining the insertion part 31 of the magnetism collection member 3 contacts the magnetic member 1 on a side opposite to a side where the magnetic field generation unit 11 is disposed. In order to reduce a magnetic resistance due to a gap between the magnetic member 1 and the magnetism collection member 3, the insertion part 31 desirably has a curved shape along an outer shape of the magnetic member 1. That is, if the cross section of the magnetic member 1 is circular, the insertion part 31 is also desirably a circular hole.

The magnetism collection member 3 includes a first component 33 on an opposite side of a boundary plane 32 to the magnetic field generation unit 11, and a second component 34 on the same side of the boundary plane 32 as the magnetic field generation unit 11, the boundary plane 32 being defined as an imaginary plane passing through a center 52 of an imaginary inscribed circle 51 in parallel to an imaginary plane having a normal vector defined by the Z-axis direction, the inscribed circle 51 being inscribed in the insertion part 31 and having a diameter equal to a length of the insertion part 31 in the Y-axis direction. The imaginary inscribed circle 51 passes a location where the magnetic member 1 is in contact with the insertion part 31. In the example of FIG. 2, the imaginary inscribed circle 51 passes through a portion of the insertion part 31, which portion is in contact with the magnetic member 1 and opposite to a location where the magnetic field generation unit 11 is disposed. In the example of FIG. 2, a normal vector is a vector directed from the magnetism collection member 3 toward the magnetic field generation unit 11. The magnetism collection member 3 has a structure in which a volume of the second component 34 is larger than a volume of the first component 33. In a cross section perpendicular to the direction of extension of the magnetic member 1, the soft magnetic body described in Patent Literature 1 has a shape symmetrical in the Z-direction with respect to a boundary defined by the above-described boundary plane 32, but the magnetism collection member 3 of the power generation element 100 according to the first embodiment has an asymmetric shape in the Z-direction with respect to a boundary defined by the above-described boundary plane 32.

Although detailed later, in the magnetism collection member 3 in the first embodiment, a volume ratio of the second component 34 to the first component 33 is between 1 and 4, inclusive, and more preferably between 1.3 and 2.6, inclusive. This range makes it possible to reduce a phase difference of a rotational phase of the magnetic field generation unit 11 that generates an electromotive force in the power generation coil 2 as compared with a conventional one, and achieve an almost uniformly distributed magnetic flux density in the direction of extension of the magnetic member 1 as well. It is noted that the magnetism collection member 3 as discussed herein is between 1.0 mm and 1.5 mm, inclusive in thickness, and 1.0 mm and 2.5 mm, inclusive in width, and the thickness and the width are constant. For such a magnetism collection member 3, the first component 33 has a length in the Z-direction between 1.0 mm and 2.0 mm, inclusive, and the second component 34 has a length between 1.1 mm and 2.5 mm, inclusive. However, the length of the first component 33 and the length of the second component 34 are set such that a volume ratio of the second component 34 to the first component 33 is greater than 1 but 4 or less. The size of the magnetism collection member 3 indicated herein is an example, and the thickness, the width, and the length, of the magnetism collection member 3 are not limited. For example, the first component 33 and the second component 34 may be different in thickness or width, or may be different in two or more of thickness, width, and length.

In addition, in order to enhance a magnetism collecting effect of the external magnetic field 60 generated from the magnetic field generation unit 11, it is desirable that the magnetism collection member 3 have a flat surface 35a facing the magnetic field generation unit 11. A surface 35b of the magnetism collection member 3 on the side opposite to the surface 35a facing the magnetic field generation unit 11 is also desirably flat.

Returning to FIG. 1, the magnetic field generation unit 11 is a magnetic field generation source disposed around the magnetic member 1 and applying the changing external magnetic field 60 to the magnetic member 1. The magnetic field generation unit 11 only needs to have one or more sets of two magnetic poles, that is, an N pole and an S pole, and generate the external magnetic field 60 around the magnetic field generation unit 11. In the example of FIG. 1, the magnetic field generation unit 11 is a circular flat plate-shaped magnet rotatable about the Z axis. In the example of FIG. 1, the magnetic field generation unit 11 includes magnet components 111A and 111B which are two semicircular components. The magnet component 111A is a magnet with an N-pole surface facing the power generation element 100 and the opposite S-pole surface. The magnet component 111B is a magnet with an S-pole surface facing the power generation element 100 and the opposite N-pole surface. That is, in the magnetic field generation unit 11, a half of the surface of the disk-shaped magnet facing the power generation element 100 is the N pole, and the other half is the S pole. A magnetization direction of the magnetic field generation unit 11 is desirably a direction intersecting a surface 11a of the magnetic field generation unit 11 facing the power generation element 100. In one example, the magnetic field generation unit 11 is desirably magnetized such that a magnetic flux flows out from the surface 11a of the magnet component 111A of the magnetic field generation unit 11 through the power generation element 100 side to the surface 11a of the magnet component 111B. In particular, the magnetization direction is desirably a direction perpendicular or almost perpendicular to the surface 11a facing the power generation element 100. In the example illustrated in FIG. 1, a magnetization direction of the magnetic field generation unit 11 is desirably a magnetization direction perpendicular to the surface facing the power generation element 100, in which direction a strong magnetic flux is output toward the magnetism collection member 3 as indicated by an arrow A in FIG. 1. However, this is an example, the magnetization direction is not limited. In another example, the magnetic field generation unit 11 may be magnetized in a radial direction thereof. Then, the magnet is rotatable about an axis passing through a center portion of the disk-shaped magnet. The magnetic field generation unit 11 has a diameter between 20 mm and 22 mm, inclusive, and a distance between the magnetic member 1 and the magnetic field generation unit 11 is between 6 mm and 9 mm, inclusive. However, this is an example, and does not limit the diameter of the magnetic field generation unit 11 and the distance between the magnetic member 1 and the magnetic field generation unit 11.

Although a permanent magnet is preferably used as the magnetic field generation unit 11, the magnetic field generation unit 11 may be made of any material that can generate the external magnetic field 60 stably. For example, and the magnetic field generation unit 11 may be an electromagnet. A ferrite magnet, an alnico (Al—Ni—Co) magnet, a rare earth magnet, or the like can be used as the permanent magnet. Examples of the rare earth magnet include a neodymium magnet and a samarium cobalt magnet. In addition, a plastic material containing magnetic material particles may be molded by injection molding etc. for use as a magnet.

Figure 3:
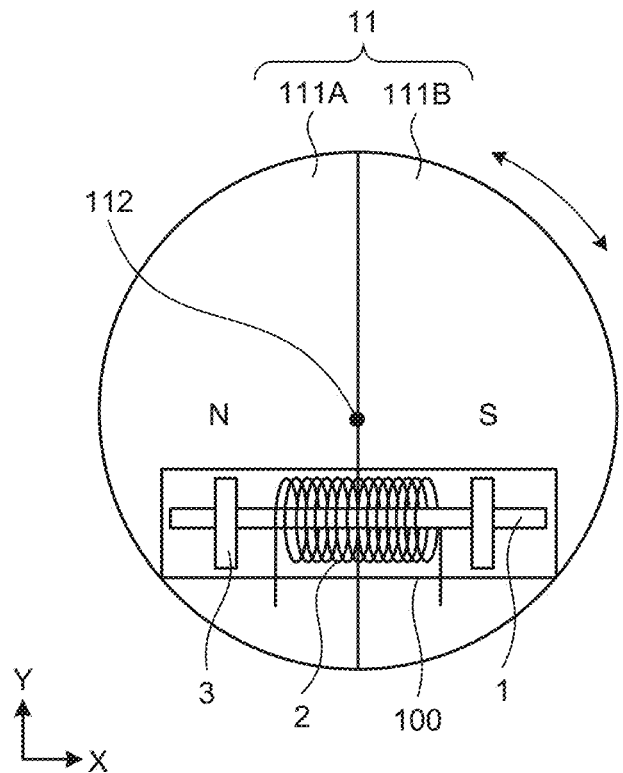
FIG. 3 is a top view illustrating an example of a positional relation between the power generation element and a magnetic field generation unit according to the first embodiment.

FIG. 3 is a top view illustrating an example of a positional relation between the power generation element and the magnetic field generation unit according to the first embodiment. A boundary between the magnet component 111A and the magnet component 111B of the magnet is shown as extending in the Y-direction perpendicular to the direction of extension of the magnetic member 1 in an XY plane.

The magnetic field generation unit 11 applies the external magnetic field 60 to the power generation element 100 by rotating about a rotation center 112. In the power generation element 100, the magnetic member 1 of the power generation element 100 is disposed 5 mm or more away in a radial direction from the rotation center 112 of the magnetic field generation unit 11. In a case where the power generation element 100 is disposed at a position shifted in the radial direction from the rotation center 112 of the magnetic field generation unit 11, as described above, the external magnetic field 60 of the magnetic field generation unit 11 is weaker at the position where the power generation element 100 is disposed than that at the rotation center 112 of the magnetic field generation unit 11. In view of this, in the power generation element 100 according to the first embodiment, the magnetism collection member 3 in which a volume ratio of the second component 34 to the first component 33 is more than 1 but 4 or less is disposed at each of opposite ends of the magnetic member 1. Next, a function of the magnetism collection member 3 will be described.

<Function of Magnetism Collection Member 3>

Figure 4:
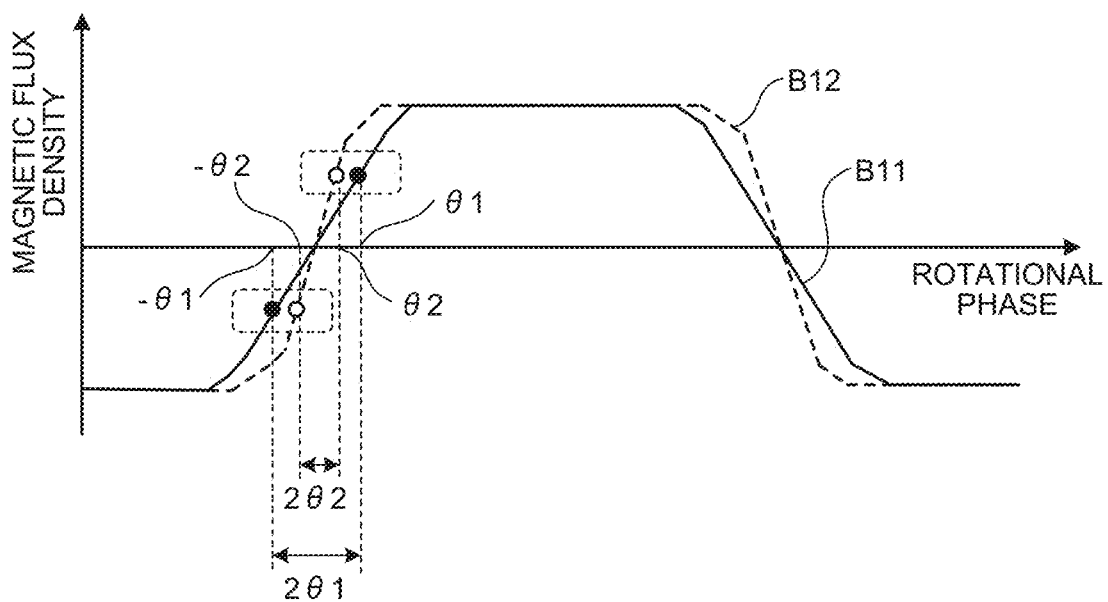
FIG. 4 is a graph schematically illustrating an example of a relationship between a rotational phase of the magnetic field generation unit and a magnetic flux density of a magnetic member with respect to the magnetic field generation unit.

FIG. 4 is a graph schematically illustrating an example of a relationship between a rotational phase of the magnetic field generation unit and a magnetic flux density of the magnetic member with respect to the magnetic field generation unit. In this graph, a horizontal axis represents the rotational phase of the magnetic field generation unit 11, and a vertical axis represents the magnetic flux density of the magnetic member 1. Further, this graph indicates a graph B11 of a conventional magnetism collection member 3 in which the volume ratio of the second component 34 to the first component 33 is 1 and a graph B12 of the magnetism collection member 3 according to the first embodiment in which the volume ratio is larger than 1.

In general, when two or more magnets as the magnetic field generation unit 11 are rotated, a rotational phase of the magnetic field generation unit 11 at which phase to produce the large Barkhausen effect varies depending on a direction of rotation of the magnetic field generation unit 11. As illustrated in the graph B11, the conventional magnetism collection member 3 produces the large Barkhausen effect at a rotational phase of θ1 when the magnetic field generation unit 11 rotates in the clockwise direction with an inter-pole of the magnetic field generation unit 11 as a boundary. When the magnetic field generation unit 11 rotates in the counterclockwise direction, in contrast, the conventional magnetism collection member 3 produces the large Barkhausen effect at −θ1, with an inter-pole of the magnetic field generation unit 11 as a boundary. This means that the different directions of rotation of the magnetic field generation unit 11 causes a phase difference of 2θ1 illustrated in FIG. 4 in the rotational phase of the magnetic field generation unit 11 at which phase to produce the large Barkhausen effect. That is, the phase difference of 2θ1 occurs in the rotational phase of the magnetic field generation unit 11 that generates the electromotive force in the power generation coil 2. When the power generation element 100 is practically used in a device such as an encoder, it is desirable that the rotational phase of the magnetic field generation unit 11 that generates the electromotive force is less changed depending on the rotation direction of the magnetic field generation unit 11.

In addition, as illustrated in FIG. 3, in a case where the power generation element 100 is disposed at the position shifted in the radial direction from the rotation center 112 of the magnetic field generation unit 11, the external magnetic field 60 of the magnetic field generation unit 11 is weaker at that shifted position than at the rotation center 112 of the magnetic field generation unit 11. The change of the external magnetic field 60 of the magnetic field generation unit 11 applied to the magnetic member 1 is gentle with respect to the rotational phase of the magnetic field generation unit 11. As a result, depending on the rotation direction of the magnetic field generation unit 11, the rotational phase difference of the magnetic field generation unit 11 at which phase to produce the large Barkhausen effect also increases. That is, the rotational phase difference of the magnetic field generation unit 11 that generates the electromotive force also increases.

In the case of the magnetism collection member 3 according to the first embodiment, the second component 34 of the magnetism collection member 3 is larger than the first component 33, thereby enhancing the magnetism collecting effect and hence increasing the magnetic flux passing through the magnetic member 1, as compared with the conventional magnetism collection member 3. As illustrated in FIG. 4, therefore, in the case of the rotation in the clockwise direction, the large Barkhausen effect occurs at the rotational phase of θ2 smaller than θ1, with an inter-pole of the magnetic field generation unit 11 as a boundary. In the case of the rotation in the counterclockwise direction, the large Barkhausen effect occurs at −θ2, with an inter-pole of the magnetic field generation unit 11 as a boundary. In this way, the different directions of rotation of the magnetic field generation unit 11 cause a smaller difference 202 in rotational phase of the magnetic field generation unit 11 that produces the large Barkhausen effect than a rotational phase difference 2θ1 of the conventional magnetism collection member 3, thereby reducing a difference in rotational phase of the magnetic field generation unit 11 that generates the electromotive force.

Figure 5:
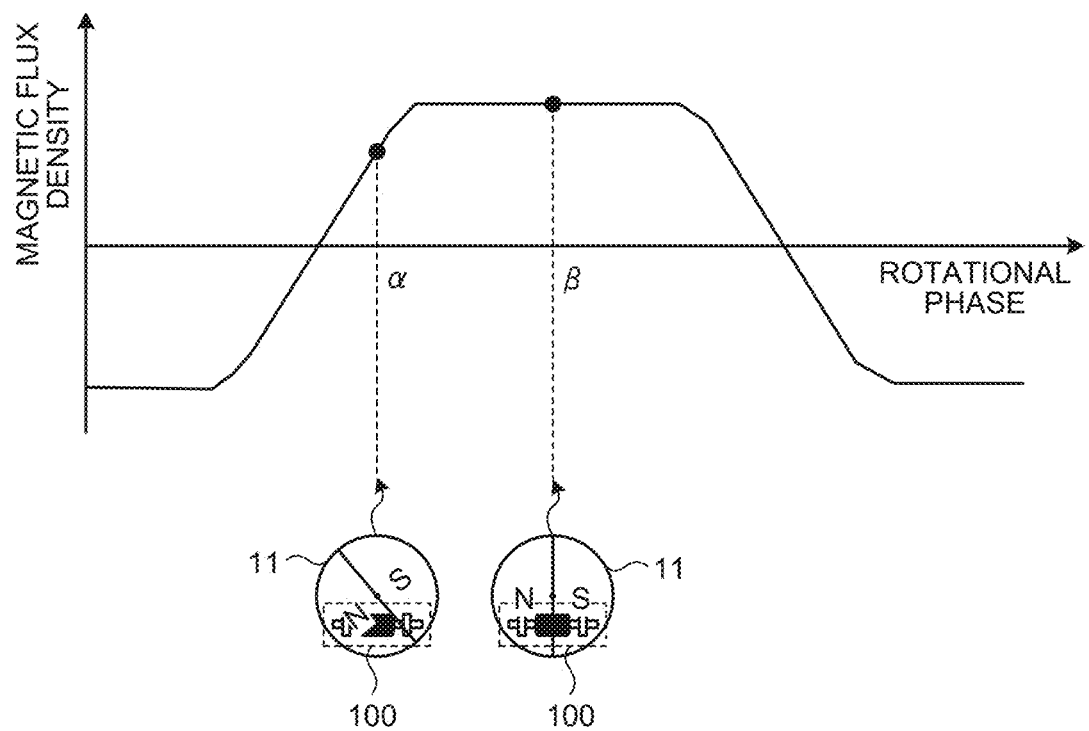
FIG. 5 is a graph schematically illustrating an example of a relationship between a rotational phase of the magnetic field generation unit and a magnetic flux density of the magnetic member with respect to the magnetic field generation unit.

FIG. 5 is a graph schematically illustrating an example of a relationship between a rotational phase of the magnetic field generation unit and a magnetic flux density of the magnetic member with respect to the magnetic field generation unit. Also in FIG. 5, a horizontal axis represents the rotational phase of the magnetic field generation unit 11, and a vertical axis represents the magnetic flux density of the magnetic member 1. As illustrated in FIG. 5, when the rotational phase of the magnetic field generation unit 11 is α, the magnetic flux density of the magnetic member 1 is increasing due to the external magnetic field 60 generated from the magnetic field generation unit 11. When the rotational phase of the magnetic field generation unit 11 is β, the magnetic flux density of the magnetic member 1 is maximized by the external magnetic field 60 generated from the magnetic field generation unit 11. Note that, FIG. 5 schematically illustrates a state of the magnetic field generation unit 11 with respect to the power generation element 100 in α and β.

Figure 6:
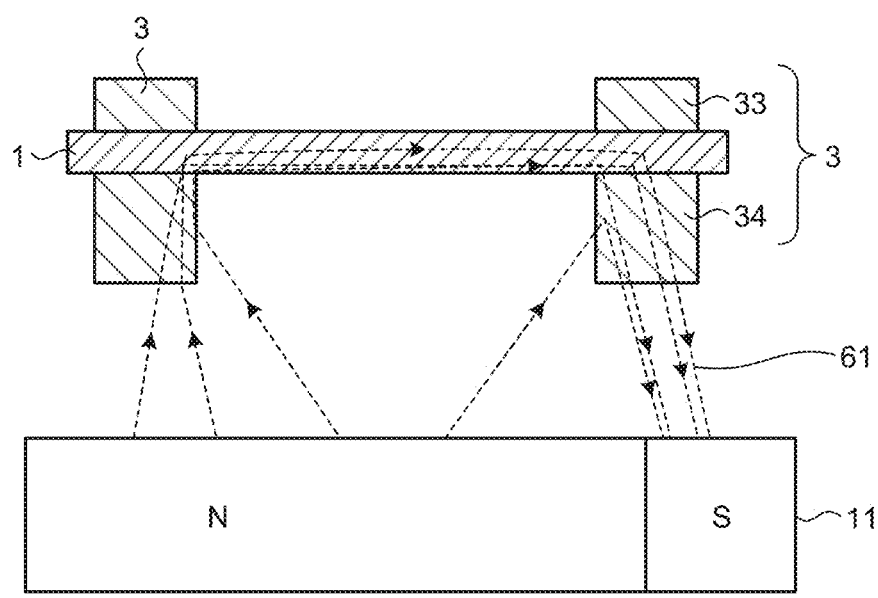
FIG. 6 is a view schematically illustrating a state of a magnetic flux passing through the magnetic member in the power generation element including a magnetism collection member according to the first embodiment, when a rotational phase of the magnetic field generation unit is α.
Figure 7:
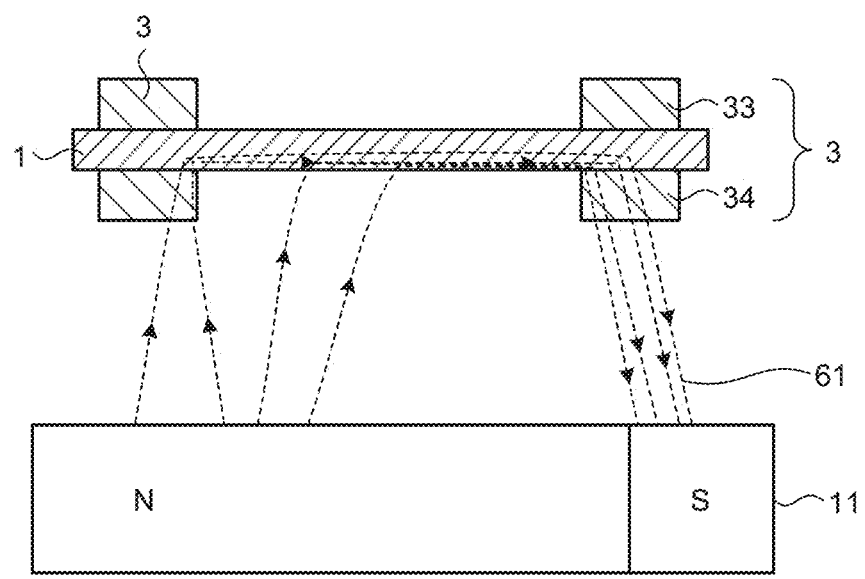
FIG. 7 is a view schematically illustrating a state of a magnetic flux passing through the magnetic member in a power generation element including a conventional magnetism collection member when a rotational phase of the magnetic field generation unit is α.
Figure 8:
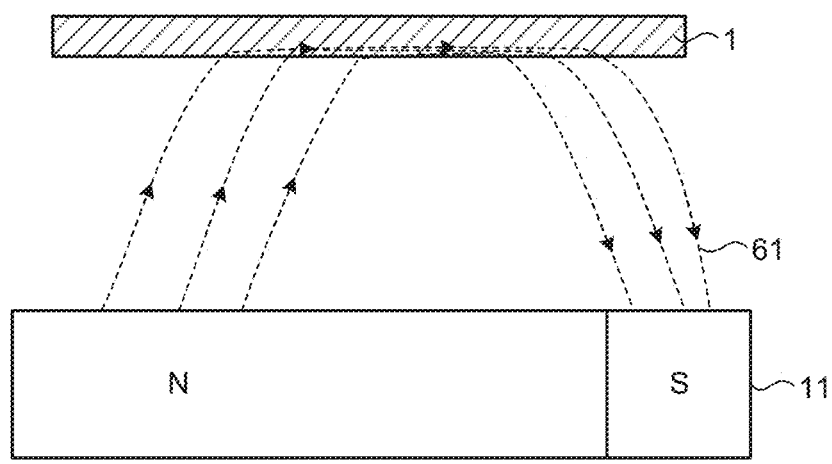
FIG. 8 is a view schematically illustrating a state of a magnetic flux passing through the magnetic member in a power generation element not including a magnetism collection member when a rotational phase of the magnetic field generation unit is α.

FIG. 6 is a view schematically illustrating a state of a magnetic flux passing through the magnetic member in the power generation element including the magnetism collection member according to the first embodiment, when a rotational phase of the magnetic field generation unit is α. FIG. 7 is a view schematically illustrating a state of a magnetic flux passing through the magnetic member in a power generation element including a conventional magnetism collection member when a rotational phase of the magnetic field generation unit is α. FIG. 8 is a view schematically illustrating a state of a magnetic flux passing through the magnetic member in the power generation element not including a magnetism collection member when a rotational phase of the magnetic field generation unit is α. Note that, in FIGS. 6 to 8, the power generation coil 2 is not illustrated. FIGS. 6 to 8 schematically illustrate what path a magnetic flux 61 output from the magnetic field generation unit 11 will take in returning to the magnetic field generation unit 11 when the rotational phase of the magnetic field generation unit 11 is α.

As illustrated in FIG. 6, in the power generation element 100 including the magnetism collection member 3 according to the first embodiment, most of the magnetic fluxes 61 output from the N pole of the magnetic field generation unit 11 pass through the magnetic member 1 via the magnetism collection member 3, and enter the S pole of the magnetic field generation unit 11 from the magnetism collection member 3. With the larger volume of the second component 34 than the volume of the first component 33, as discussed above, most of the magnetic fluxes 61 from the magnetic field generation unit 11 can pass through the magnetism collection member 3. That is, since there is almost no magnetic flux 61 entering the magnetic member 1 from the middle in the direction of extension of the magnetic member 1 as illustrated in FIGS. 7 and 8 described later, the uniformity of the magnetic flux density is maintained in the direction of extension of the magnetic member 1. Note that the magnetic flux 61 is magnetically collected into the magnetism collection member 3 disposed close to the magnetic flux exiting from the magnetic field generation unit 11. As a result, in FIG. 6, a part of the magnetic fluxes 61 passes through the magnetism collection member 3 disposed on the S-pole side, such that the part of the magnetic fluxes 61 enters the S-pole of the magnetic field generation unit 11 from the magnetism collection member 3 without passing through the magnetic member 1. Such magnetic flux 61, which does not pass through the magnetic member 1, does not affect the uniformity of the magnetic flux density in the magnetic member 1 sandwiched between the magnetism collection members 3.

As illustrated in FIG. 7, in the power generation element 100 including the conventional magnetism collection member 3, the magnetic flux 61 output from the N pole of the magnetic field generation unit 11 takes a path passing through the magnetic member 1 and returning to the S pole. However, in the case of FIG. 7, among the magnetic fluxes 61 output from the N pole, the magnetic flux 61 taking the path near the magnetism collection member 3 passes through the magnetism collection member 3, but the magnetic flux 61 taking the path not near the magnetism collection member 3 enters the magnetic member 1 at any position between the magnetism collection members 3. The magnetic flux 61 that has entered the magnetic member 1 flows toward the S pole of the magnetic field generation unit 11 via the magnetism collection member 3. The second component 34 of the magnetism collection member 3 is farther away from the magnetic field generation unit 11 than in the case of FIG. 6. As a result, a part of the magnetic fluxes 61 enters positions on the magnetic member 1 in the direction of extension of the magnetic member 1, without passing through the magnetism collection member 3. That is, the magnetic fluxes 61 passing through the magnetic member 1 close to the magnetism collection member 3 disposed on the N-pole side decrease as compared with the case of FIG. 6. As a result, the magnetic flux density becomes non-uniform in the direction of extension of the magnetic member 1.

In the power generation element 100 not including the magnetism collection member 3 illustrated in FIG. 8, the magnetic flux 61 output from the N pole of the magnetic field generation unit 11 takes a path passing through the magnetic member 1 in returning to the S pole. In this case, a position where the magnetic flux 61 enters the magnetic member 1 changes depending upon a position where the magnetic flux 61 exits from the magnetic field generation unit 11. Further, a position where the magnetic flux 61 exits from the magnetic member 1 also changes depending upon a position where the magnetic flux 61 enters the magnetic field generation unit 11. For this reason, the magnetic flux density is further non-uniform in the extending direction of the magnetic member 1, as compared with the case of FIG. 7.

In particular, in a case where the power generation element 100 illustrated in FIGS. 7 and 8 is disposed at a position shifted in the radial direction from the rotation center 112 of the magnetic field generation unit 11, the external magnetic field 60 of the magnetic field generation unit 11 produces the non-uniform magnetic flux density of the magnetic member 1 of the power generation element 100, depending on the rotational phase of the magnetic field generation unit 11. As a result, the large Barkhausen effect is less likely to occur simultaneously in the entire magnetic member 1, which leads to a problem of deterioration of power generation characteristics.

Figure 9:
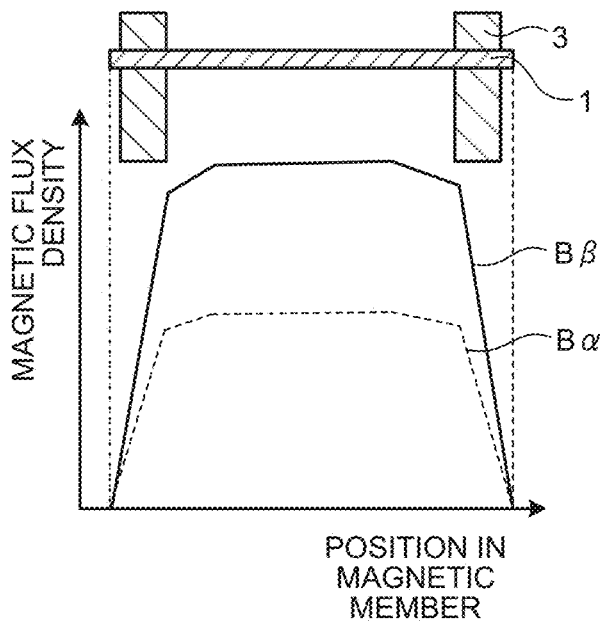
FIG. 9 is a view illustrating an example of a distribution of an internal magnetic flux density when a rotational phase of the magnetic field generation unit is α and β, for the magnetic member of the power generation element according to the first embodiment.
Figure 10:
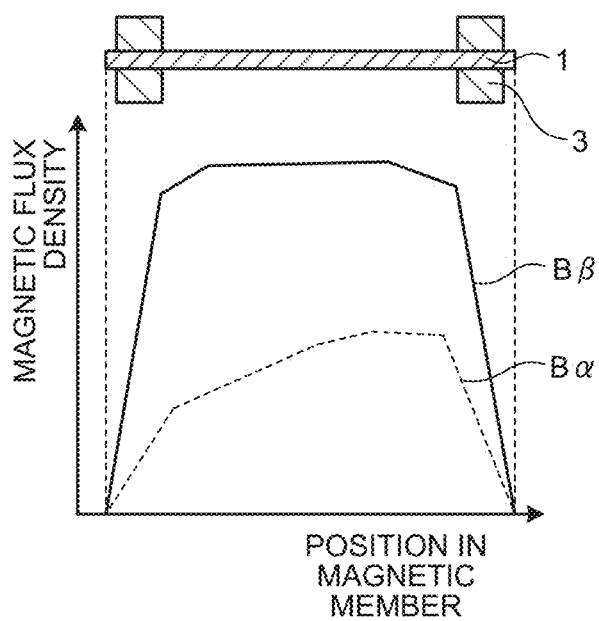
FIG. 10 is a view illustrating an example of a distribution of an internal magnetic flux density when a rotational phase of the magnetic field generation unit is α and β, for the magnetic member of the conventional power generation element.
Figure 11:
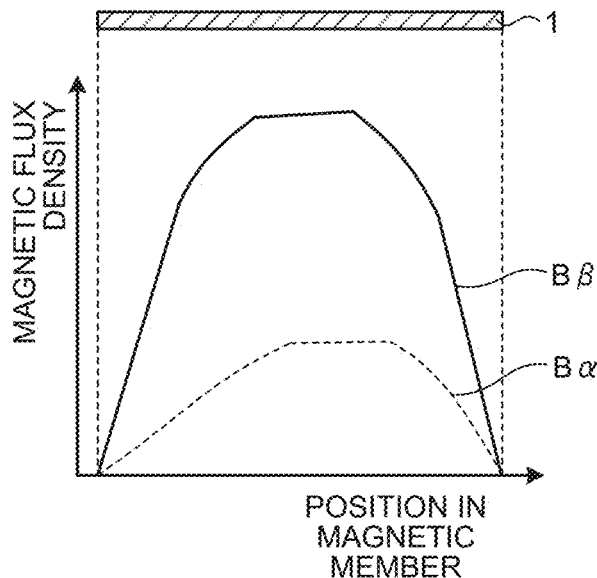
FIG. 11 is a view illustrating an example of a distribution of an internal magnetic flux density when a rotational phase of the magnetic field generation unit is α and β, for the magnetic member of the power generation element not including a magnetism collection member.

FIG. 9 is a view illustrating an example of a distribution of an internal magnetic flux density when a rotational phase of the magnetic field generation unit is α and β, for the magnetic member of the power generation element according to the first embodiment. FIG. 10 is a view illustrating an example of a distribution of an internal magnetic flux density when a rotational phase of the magnetic field generation unit is α and β, for the magnetic member of the conventional power generation element. FIG. 11 is a view illustrating an example of a distribution of an internal magnetic flux density when a rotational phase of the magnetic field generation unit is α and β, for the magnetic member of the power generation element not including a magnetism collection member. In these views, a horizontal axis represents a position in the magnetic member 1, and a vertical axis represents the magnetic flux density at each position in the magnetic member 1. Further, in these views, Bα indicates a distribution of a magnetic flux density for the rotational phase α of the magnetic field generation unit 11, and Bβ indicates a magnetic flux density of a distribution for the rotational phase β of the magnetic field generation unit 11. In FIGS. 9 to 11, in order to facilitate understanding of a positional relationship between the magnetic member 1 and the distribution of the magnetic flux density, cross-sectional views of the magnetic member 1 and the magnetism collection member 3 are illustrated in an upper part of the figure in association with data on the magnetic flux density.

Assume that the equal magnetic flux densities between the magnetism collection members 3 disposed at opposite end portions of the magnetic member 1 are considered uniform, and the non-equal magnetic flux densities are considered non-uniform. For the power generation element 100 according to the first embodiment illustrated in FIG. 6, the magnetic flux 61 from the magnetic field generation unit 11 passes through the magnetism collection members 3 at opposite end portions of the magnetic member 1. As illustrated in FIG. 9, thus, magnetic flux densities Bα and Bβ are considered uniform in almost the entire magnetic member 1 in a region sandwiched between the magnetism collection members 3 regardless of the rotational phase of the magnetic field generation unit 11.

For the conventional power generation element 100 illustrated in FIG. 7, the magnetism collection member 3 is provided, but a part of the magnetic fluxes 61 does not pass through the magnetism collection member 3. For this reason, uniform magnetic flux densities y is formed in a narrower range of the magnetic member 1 between the magnetism collection members 3 than that in the case of FIG. 6, depending on the rotational phase of the magnetic field generation unit 11. As illustrated in FIG. 10, when the rotational phase is β, the magnetic flux density BB of the magnetic member 1 between the magnetism collection members 3 is considered uniform, but the magnetic flux density Bα of the magnetic member 1 between the magnetism collection members 3 is non-uniform when the rotational phase is α. In particular, since the magnetic flux 61 passing through the magnetism collection member 3 on the side where the N pole is disposed is small as illustrated in FIG. 7, the magnetic flux density Bα rapidly decreases at one end portion corresponding to the side where the N-pole of the magnetic member 1 is disposed, as illustrated in FIG. 10.

For the power generation element 100 not including the magnetism collection member 3, as illustrated in FIG. 11, the magnetic flux densities Bα and Bβ are high at a center portion in the direction of extension of the magnetic member 1. However, a range in which the magnetic flux densities Bα and Bβ are high is further narrowed as compared with the case of FIG. 10, and the magnetic flux density rapidly decreases from the center portion to the opposite end portions. For the power generation element 100 not including the magnetism collection member 3, the uniformity of the magnetic flux densities Bα and BB inside the magnetic member 1 is greatly reduced in any rotational phase of the magnetic field generation unit 11.

As described above, the magnetic flux densities Bα and Bβ in the magnetic member 1 including the magnetism collection member 3 according to the first embodiment illustrated in FIG. 9 have high magnetic flux densities in the wider region than the magnetic flux densities Bα and Bβ illustrated in FIGS. 10 and 11 for the magnetism collection member 3 taking a different form from the magnetism collection member 3. That is, the uniformity of the magnetic flux densities Bα and Bβ is high in the region of the magnetic member 1 sandwiched between the magnetism collection members 3.

Figure 12:
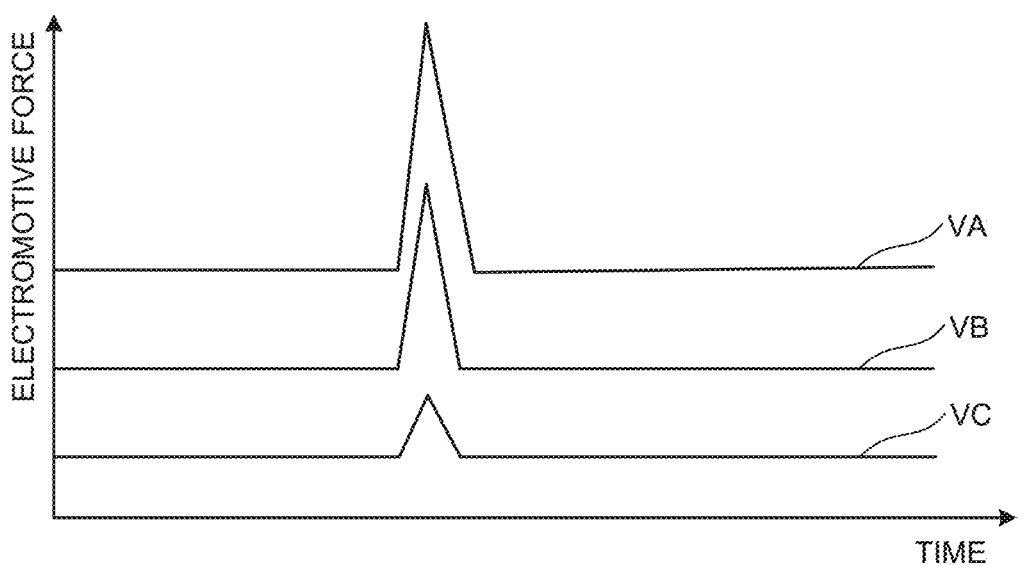
FIG. 12 is a graph illustrating an example of an electromotive force generated in the power generation element according to the first embodiment, the conventional power generation element, and a power generation element not including a magnetism collection member.

FIG. 12 is a graph illustrating an example of an electromotive force generated in the power generation element according to the first embodiment, the conventional power generation element, and the power generation element not including a magnetism collection member. In this view, a horizontal axis represents time, and a vertical axis represents an electromotive force. FIG. 12 illustrates electromotive forces VA, VB, and VC when a distribution of a magnetic flux density of the magnetic member 1 corresponds to a magnetic flux density illustrated in FIGS. 9 to 11. The electromotive force VA is induced at a magnetic flux density in the power generation element 100 including the magnetism collection member 3 according to the first embodiment illustrated in FIG. 9. The electromotive force VB is induced at a magnetic flux density in the power generation element 100 including the conventional magnetism collection member 3 illustrated in FIG. 10. The electromotive force VC is induced at a magnetic flux density in the power generation element 100 not including the magnetism collection member 3 illustrated in FIG. 11. Comparison between the electromotive forces VA, VB, and VC reveals that the largest electromotive force VA is generated in the power generation element 100 including the magnetism collection member 3 according to the first embodiment illustrated in FIG. 9 in which the region having the high magnetic flux density is the widest.

Figure 13:
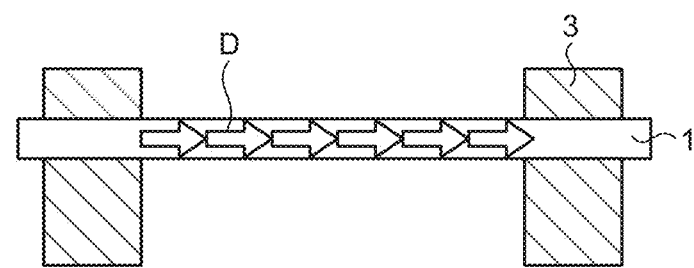
FIG. 13 is a view schematically illustrating a portion where reversal of a magnetization direction occurs due to a large Barkhausen effect in the magnetic member of the power generation element including the magnetism collection member according to the first embodiment.
Figure 14:
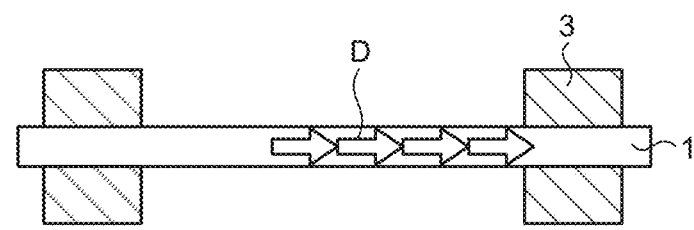
FIG. 14 is a view schematically illustrating a portion where reversal of a magnetization direction occurs due to the large Barkhausen effect in the magnetic member of the power generation element including the conventional magnetism collection member.
Figure 15:
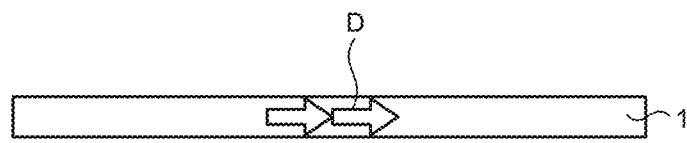
FIG. 15 is a view schematically illustrating a portion where reversal of magnetization direction occurs due to the large Barkhausen effect in the magnetic member not including the magnetism collection member.

FIG. 13 is a view schematically illustrating a portion where reversal of a magnetization direction occurs due to the large Barkhausen effect in the magnetic member of the power generation element including the magnetism collection member according to the first embodiment. FIG. 14 is a view schematically illustrating a portion where reversal of a magnetization direction occurs due to the large Barkhausen effect in the magnetic member of the power generation element including the conventional magnetism collection member. FIG. 15 is a view schematically illustrating a portion where reversal of magnetization direction occurs due to the large Barkhausen effect in the magnetic member not including the magnetism collection member. In FIGS. 13 to 14, an arrow D indicates a region having a high magnetic flux density inside each magnetic member 1 at the rotational phase α of the magnetic field generation unit 11.

In the magnetic member 1 including the magnetism collection member 3 according to the first embodiment, most of the magnetic fluxes 61 from the magnetic field generation unit 11 pass through the magnetic member 1 via the magnetism collection member 3 on the N-pole side of the magnetic field generation unit 11, and return from the magnetism collection member 3 on the S-pole side to the magnetic field generation unit 11. For this reason, the magnetic flux density of the magnetic member 1 in the region sandwiched between the two magnetism collection members 3 is constant. As illustrated in FIG. 13, the arrow D is drawn in a wide range over substantially the entire extending direction of the magnetic member 1, which indicates that reversal of the magnetization direction due to the large Barkhausen effect stably occurs in the entire region sandwiched between the two magnetism collection members 3 of the magnetic member 1. Accordingly, in the power generation element 100 having this configuration, an electromotive force of the power generation coil 2 due to electromagnetic induction is also stably increased. It is therefore possible to obtain the power generation element 100 having a wide range in which the large Barkhausen effect occurs in the magnetic member 1.

In the magnetic member 1 including the conventional magnetism collection member 3, a part of the magnetic fluxes 61 from the magnetic field generation unit 11 passes through the magnetic member 1 via the magnetism collection member 3 on the N-pole side, and return from the magnetism collection member 3 on the S-pole side to the magnetic field generation unit 11. However, the other magnetic fluxes 61 enter the magnetic member 1 without passing through the magnetism collection member 3 on the N-pole side, and return from the magnetism collection member 3 on the S-pole side to the magnetic field generation unit 11. Further, in the magnetic member 1 not including the magnetism collection member 3, as described above, the magnetic fluxes 61 from the magnetic field generation unit 11 enter the magnetic member 1 at individually different positions, and return from the magnetic member 1 to the magnetic field generation unit 11 at individually different positions. As a result, in FIGS. 14 and 15, the arrow D is distributed only in a part of the magnetic member 1 as compared with FIG. 13. In addition, the distribution range of the arrow D is narrower in the magnetic member 1 not including the magnetism collection member 3 than in the magnetic member 1 including the conventional magnetism collection member 3. That is, the large Barkhausen effect in the magnetic member 1 including the conventional magnetism collection member 3 and the magnetic member 1 not including the magnetism collection member 3 occurs only in a part of the magnetic member 1 indicated by the arrow D. It can be therefore seen that reversal of the magnetization direction is so unstable that those magnetic members 1 fail to obtain sufficient power generation characteristics as the power generation element 100.

Figure 16:
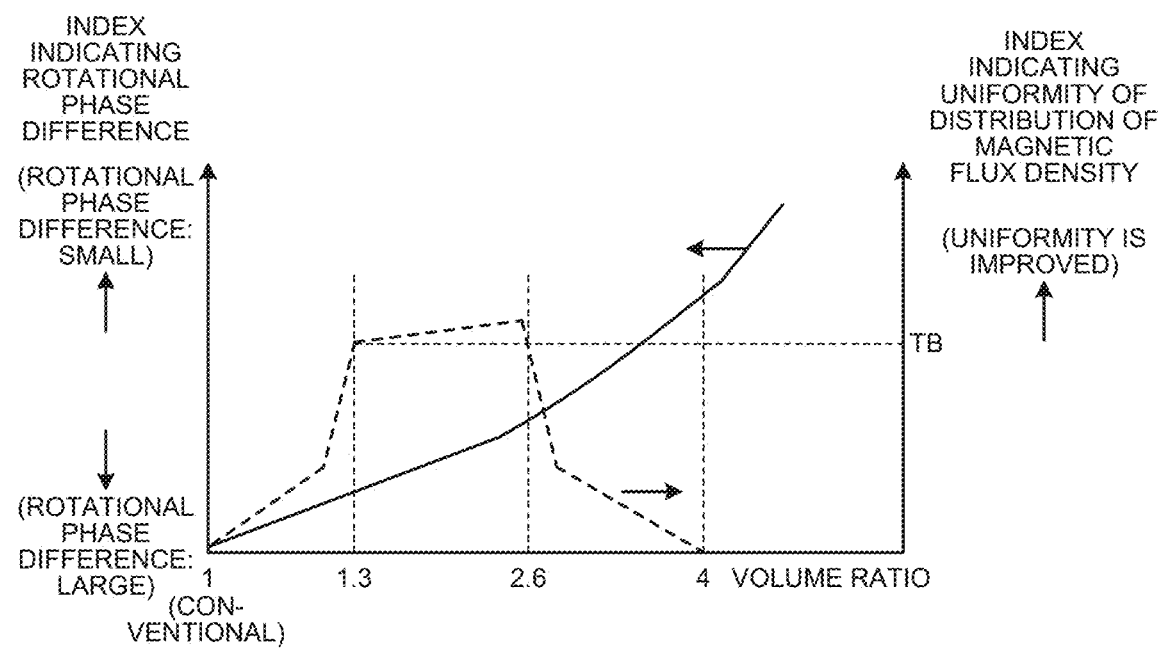
FIG. 16 is a graph illustrating an example of a relationship between a volume ratio of a second component to a first component of the magnetism collection member, and a rotational phase difference of the magnetic field generation unit that generates an electromotive force and a distribution of a magnetic flux density for the power generation element according to the first embodiment.

FIG. 16 is a graph illustrating an example of a relationship between a volume ratio of the second component to the first component of the magnetism collection member, and a rotational phase difference of the magnetic field generation unit that generates an electromotive force and a distribution of a magnetic flux density for the power generation element according to the first embodiment. In this graph, a horizontal axis represents a volume ratio of the second component 34 to the first component 33 of the magnetism collection member 3, a left vertical axis indicates an index indicating a rotational phase difference of the magnetic field generation unit 11 that generates an electromotive force, and a right vertical axis indicates an index indicating the uniformity of a distribution of the magnetic flux density. Note that, in the description of FIG. 16, the volume ratio of the second component 34 to the first component 33 is referred to as a volume ratio. The index indicating the rotational phase difference of the magnetic field generation unit 11 that generates the electromotive force is a reciprocal of the rotational phase difference of the magnetic field generation unit 11 that generates the electromotive force when the rotational phase of the magnetic field generation unit 11 is α. Further, the index indicating uniformity of the distribution of the magnetic flux density is a reciprocal of a difference value for each volume ratio relative to a difference value for the volume ratio of 1, the difference value being defined as a difference between maximum and minimum values of the magnetic flux density between the magnetism collection members 3. That is, the index indicating the uniformity of the distribution of the magnetic flux density is a value obtained by dividing the difference value for each volume ratio by the difference value for the volume ratio of 1.

As illustrated in FIG. 16, as the volume ratio is larger than 1, the rotational phase difference tends to be smaller. That is, in order to reduce the rotational phase difference, the volume of the second component 34 is desirably increased with respect to the first component 33. Whereas, the uniformity of the distribution of the magnetic flux density is improved at the volume ratio that is larger than 1 but equal to or smaller than 4 as compared with the case where the volume ratio is 1. In particular, in a range of volume ratio from 1.3 to 2.6, inclusive, the uniformity of the distribution of the magnetic flux density of the magnetic member 1 between the magnetism collection members 3 tends to increase. Then, in this case, a value of the electromotive force equal to or larger than a predetermined reference value is obtained. That is, in order to obtain the value of the electromotive force equal to or larger than the reference value, the uniformity of the distribution of the magnetic flux density is desirably equal to or larger than a threshold value TB in FIG. 16. In view of the rotational phase difference and the uniformity of the magnetic flux density distribution, the volume ratio between 1.3 and 2.6, inclusive, exhibits particularly favorable performance as the power generation element 100. Note that, although depending on a distance between the magnetic member 1 and a substrate when the power generation element 100 is provided on the substrate (not illustrated), the length of the second component 34 in the Z-direction is not larger than that of the second component 34 in contact with the substrate.

<Other Configurations of Power Generation Element 100>

Figure 17:
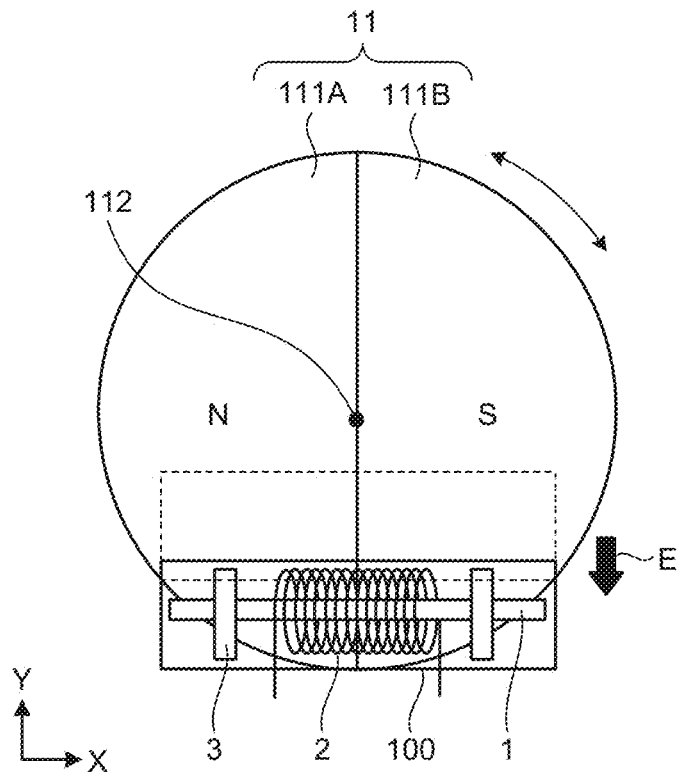
FIG. 17 is a top view illustrating another example of an arrangement between the power generation element and the magnetic field generation unit according to the first embodiment.

The arrangement between the power generation element 100 and the magnetic field generation unit 11 illustrated in FIG. 3 is an example, and the power generation element 100 can be disposed at any position with respect to the magnetic field generation unit 11. FIG. 17 is a top view illustrating another example of a positional relation between the power generation element and the magnetic field generation unit according to the first embodiment. Note that components identical to those described above are denoted by the identical reference numerals, and the description thereof will be omitted. Again, similarly to FIG. 3, a boundary between the magnet component 111A and the magnet component 111B of the magnet is shown as extending in the Y-direction perpendicular to the direction of extension of the magnetic member 1 in the XY plane. In FIG. 17, the position of the power generation element 100 in FIG. 3 is indicated by a broken line. That is, in FIG. 17, as compared with the case of FIG. 3, the power generation element 100 is disposed at a position away in a radial direction that is a direction of an arrow E from the rotation center 112 of the magnetic field generation unit 11. In a case where the power generation elements 100 is disposed away in the radial direction that is the direction of the arrow E from the rotation center 112 of the magnetic field generation unit 11, the volume ratio of the magnetism collection member 3 of the power generation element 100 is increased as compared with the volume ratio of the magnetism collection member 3 of FIG. 3, thereby allowing the magnetism collection member 3 to collect magnetism from a wider region than in the case of FIG. 3. That is, the volume ratio of the magnetism collection member 3 is preferably increased as the distance is increased in the radial direction from the rotation center 112 of the magnetic field generation unit 11.

Figure 18:
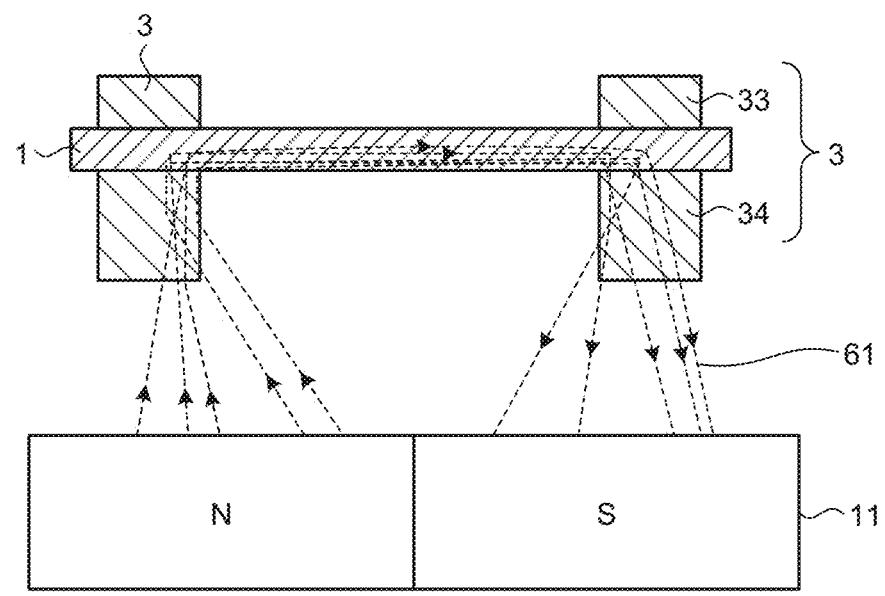
FIG. 18 is a view schematically illustrating a state of a magnetic flux passing through the magnetic member in the power generation element including the magnetism collection member according to the first embodiment, when a rotational phase of the magnetic field generation unit is β.

FIG. 18 is a view schematically illustrating a state of a magnetic flux passing through the magnetic member in the power generation element including the magnetism collection member according to the first embodiment, when a rotational phase of the magnetic field generation unit is R. Note that components identical to those described above are denoted by the identical reference numerals, and the description thereof will be omitted. FIG. 18 illustrates, by way of example, the power generation element 100 as disposed at the position in the XY plane illustrated in FIG. 17 with respect to the magnetic field generation unit 11. Using the power generation element 100 including the magnetism collection member 3 according to the first embodiment allows the magnetic flux 61 output from the N pole of the magnetic field generation unit 11 to pass through the magnetic member 1 via one magnetism collection member 3, and enter the S pole of the magnetic field generation unit 11 from the other magnetism collection member 3, as illustrated in FIG. 18. As a result, the uniformity of the magnetic flux density is maintained in the direction of extension of the magnetic member 1.

Figure 19:
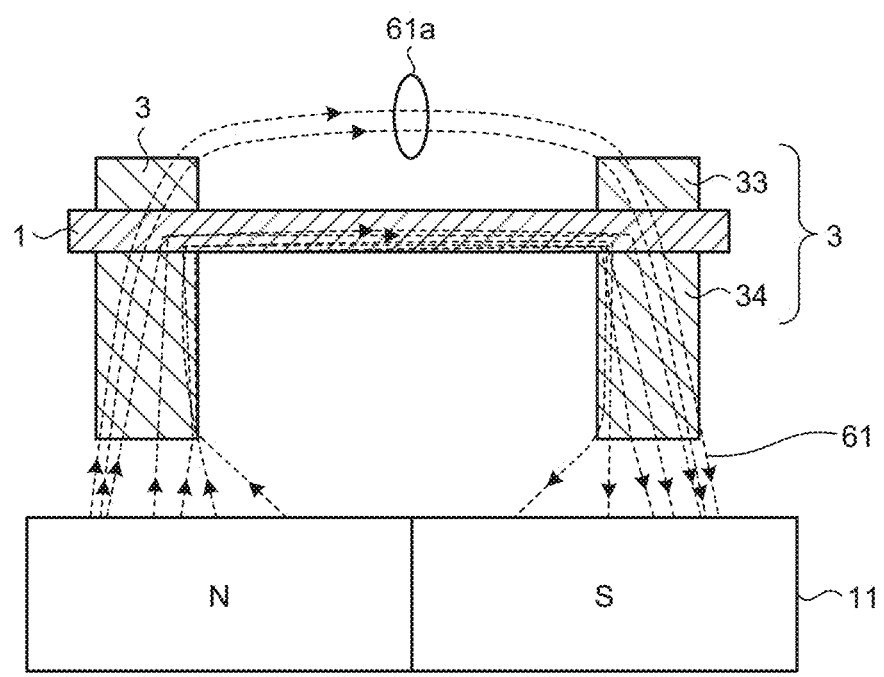
FIG. 19 is a view schematically illustrating a state of a magnetic flux passing through the magnetic member in the power generation element including the magnetism collection member according to the first embodiment, when a rotational phase of the magnetic field generation unit is β.

FIG. 19 is a view schematically illustrating a state of a magnetic flux passing through the magnetic member in the power generation element including the magnetism collection member according to the first embodiment, when a rotational phase of the magnetic field generation unit is β. FIG. 19 illustrates, by way of example, the power generation element 100 as disposed at the position in the XY plane illustrated in FIG. 17 with respect to the magnetic field generation unit 11. Further, in FIG. 19, the volume ratio of the magnetism collection member 3 is larger than that in the case of FIG. 18. That is, the volume of the second component 34 in FIG. 19 is larger than that of the second component 34 in FIG. 18. As a distance from the rotation center 112 of the magnetic field generation unit 11 increases in the radial direction, the external magnetic field of the magnetic field generation unit 11 becomes weaker. However, since the second component 34 of the magnetism collection member 3 has the increased length of in the Z-axis direction to increase the volume ratio, as illustrated in FIG. 19, it becomes possible to collect magnetism from a wider region than in the case of FIG. 18. As a result, the magnetic member 1 is saturated with the magnetic flux 61 passing therethrough while a magnetic flux 61*a*, which is output from the N pole of the magnetic field generation unit 11 but fails to pass through the magnetic member 1, passes through the air from above one magnetism collection member 3 and enters the S pole of the magnetic field generation unit 11 via the other magnetism collection member 3. The saturation of the magnetic member 1 with the magnetic flux 61 passing therethrough makes it possible to maintain the uniformity of the magnetic flux density in the direction of extension of the magnetic member 1.

Figure 20:
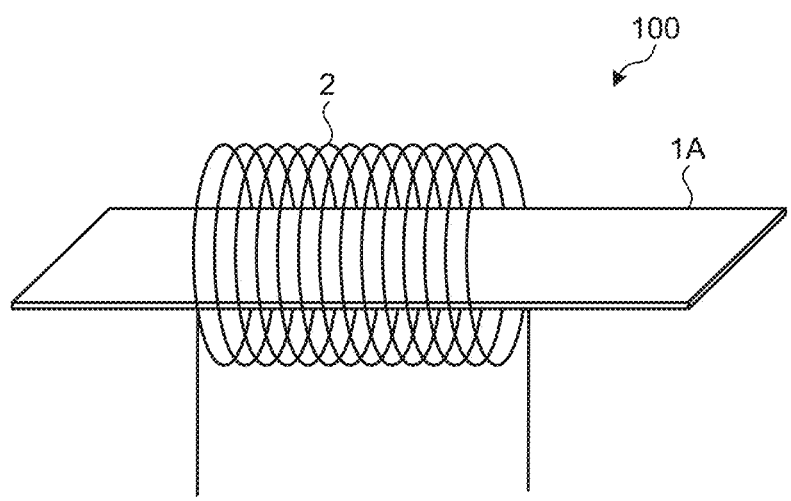
FIG. 20 is a perspective view illustrating an example of a configuration of the magnetic member and the power generation coil of the power generation element according to the first embodiment.

The magnetic member 1 has been described as having a linear shape, but the magnetic member 1 may have a sheet shape. FIG. 20 is a perspective view illustrating an example of a configuration of the magnetic member and the power generation coil of the power generation element according to the first embodiment. Note that components identical to those in FIG. 1 are denoted by the identical reference numerals, and the description thereof will be omitted. In the power generation element 100 of FIG. 20, a magnetic member 1A is a sheet-shaped magnetic body. The magnetic member 1A is configured such that at least two layers of materials having different coercive forces are layered together. In one example, the magnetic member 1A may be configured such that a first layer is sandwiched between second layers disposed on upper and lower sides of the first layer and having coercive forces different from that of the first layer. In addition, in the magnetic member 1A, a periphery of the first layer may be covered with the second layer having a coercive force different from that of the first layer. The power generation coil 2 is wound around the sheet-shaped magnetic member 1A. Also in this case, the magnetism collection member 3 disposed at each of opposite ends of the magnetic member 1A has the volume ratio of the second component 34 to the first component 33 larger than 1 but 4 or less, and preferably between 1.3 and 2.6, inclusive.

Further, the magnetic member 1 has been described as having the smaller coercive force at the outer peripheral portion in the cross section perpendicular to the extending direction of the magnetic member 1 than at the center portion. However, any magnetic member 1 having the coercive force different between the outer peripheral portion and the center portion may be used, and, for example, the coercive force at the outer peripheral portion may be larger than at the center portion.

Figure 21:
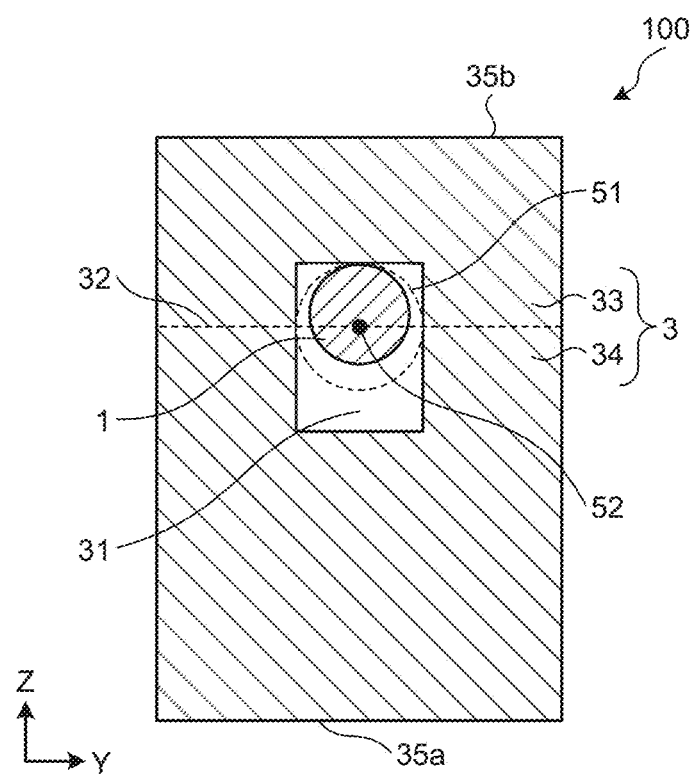
FIG. 21 is a cross-sectional view illustrating another example of a configuration of the power generation element according to the first embodiment.

In FIG. 2, the insertion part 31 of the magnetism collection member 3 through which the magnetic member 1 is inserted has a curved shape, but the insertion part 31 is not limited thereto. FIG. 21 is a cross-sectional view illustrating another example of a configuration of the power generation element according to the first embodiment. Note that components identical to those described above are denoted by the identical reference numerals, and the description thereof will be omitted. In the example illustrated in FIG. 21, the insertion part 31 is defined by a rectangular hole. The hole defining the insertion part 31 may have another shape.

For the power generation element 100 described above, the magnetic member 1 is disposed 5 mm or more away from the rotation center 112 of the magnetic field generation unit 11 in the radial direction, but the magnetic member 1 is not limited thereto. In one example, the magnetic member 1 may be disposed a distance of less than 5 mm away from the rotation center 112 of the magnetic field generation unit 11 in the radial direction.

Figure 22:
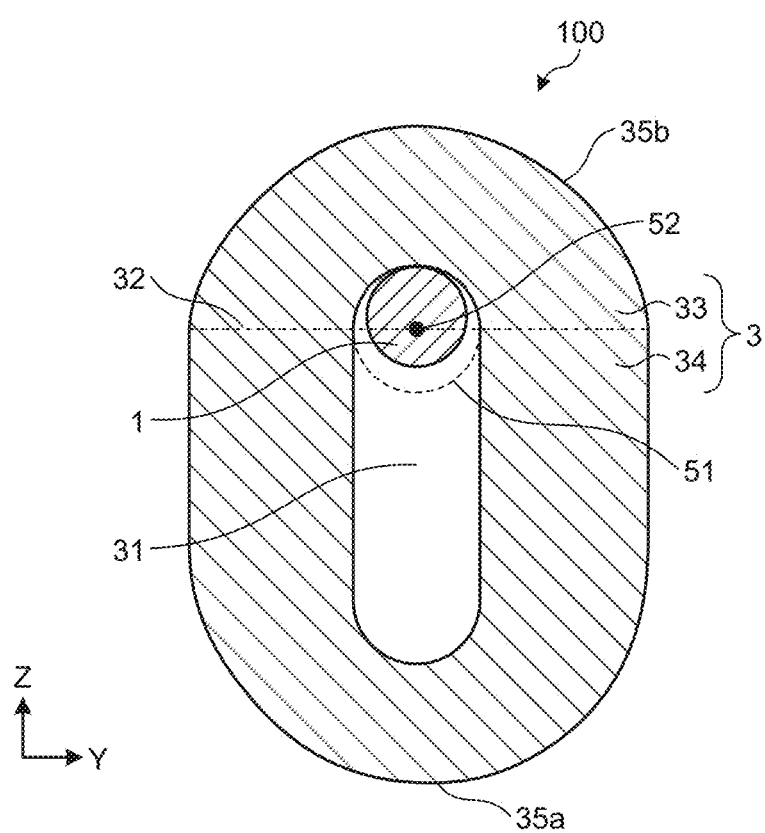
FIG. 22 is a cross-sectional view illustrating another example of a configuration of the power generation element according to the first embodiment.

For the power generation element 100 described above, the surface 35*a* of the magnetism collection member 3 facing the magnetic field generation unit 11 has been describe as being flat, as illustrated in FIG. 2, but the surface 35*a* is not limited thereto. FIG. 22 is a cross-sectional view illustrating another example of a configuration of the power generation element according to the first embodiment. Note that components identical to those described above are denoted by the identical reference numerals, and the description thereof will be omitted. As illustrated in FIG. 22, as long as the volume ratio of the second component 34 to the first component 33 is larger than 1, the surface 35a facing the magnetic field generation unit 11 may be curved.

Figure 23:
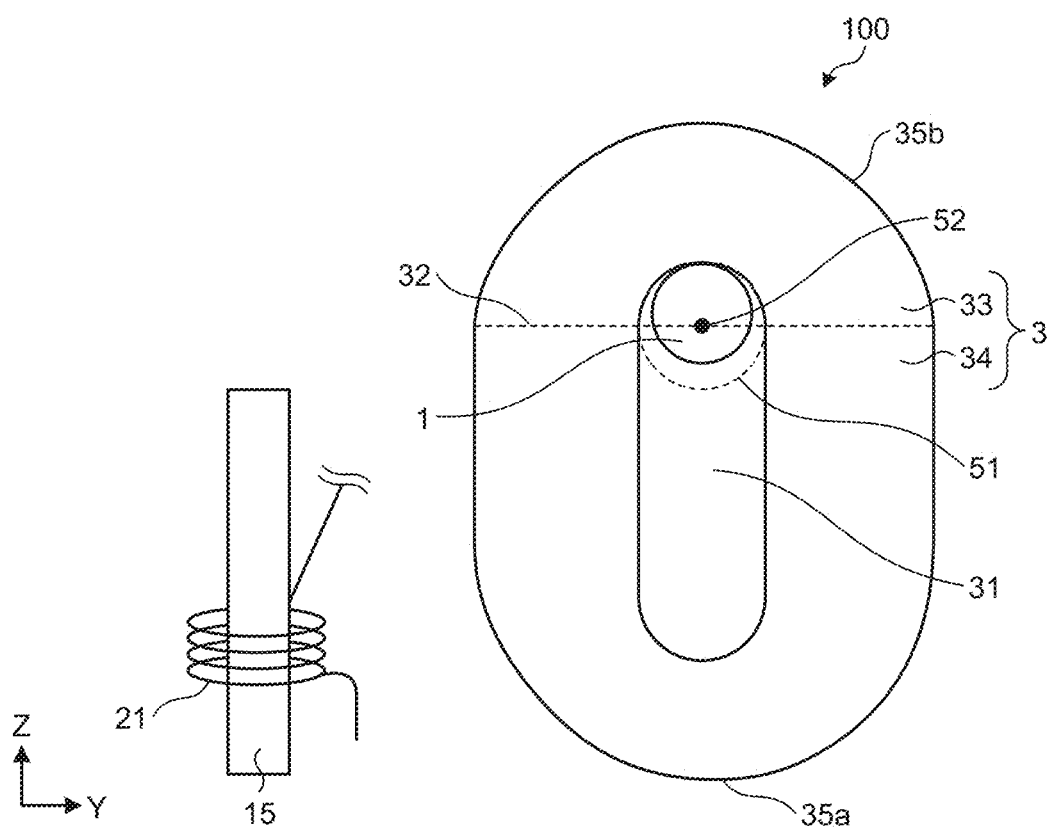
FIG. 23 is a partial side view illustrating another example of a configuration of the power generation element according to the first embodiment.

FIG. 23 is a partial side view illustrating another example of a configuration of the power generation element according to the first embodiment. Note that components identical to those described above are denoted by the identical reference numerals, and the description thereof will be omitted. In one example, the power generation element 100 is secured to a substrate (not illustrated), and a terminal 15 is provided near the magnetism collection member 3 of the power generation element 100 on the substrate. The terminal 15, which is connected to a terminal wire 21 of the power generation coil 2, outputs, to the outside, an electromotive force generated in the power generation coil 2. When the terminal wire 21 of the power generation coil 2 is bound to the terminal 15 near the magnetism collection member 3, the magnetism collection member 3 illustrated in FIG. 22 is less likely to catch the terminal wire 21 thereon, such that the terminal wire 21 is less likely to be broken, as compared with the magnetism collection member 3 having the non-curved surface on the magnetic field generation unit 11 side as illustrated in FIG. 2. This makes it possible to improve binding work efficiency near the magnetism collection member 3, and thus stably manufacture the power generation element 100 having a high output.

Further, FIG. 2 illustrates an example in which the opposite surface of the magnetism collection member 3 to the surface 35a facing the magnetic field generation unit 11 is flat, but the surface is not limited thereto. As illustrated in FIGS. 22 and 23, as long as the volume ratio of the second component 34 to the first component 33 is larger than 1, the opposite surface 35b to the surface 35a facing the magnetic field generation unit 11 may be curved.

Figure 24:
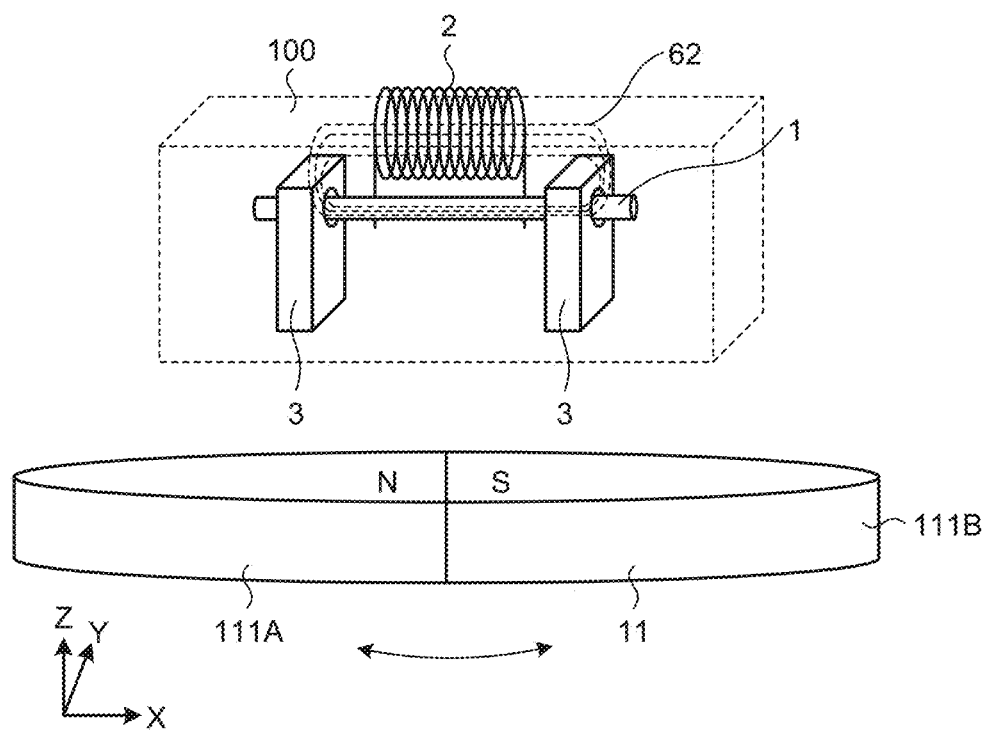
FIG. 24 is a perspective view illustrating another example of a configuration of the power generation element according to the first embodiment.

As illustrated in FIG. 1, the power generation coil 2 is preferably disposed surrounding the magnetic member 1 such that a change in the magnetic flux due to the large Barkhausen effect of the magnetic member 1 is maximized, but the power generation coil 2 may not be disposed in another manner. FIG. 24 is a perspective view illustrating another example of a configuration of the power generation element according to the first embodiment. Note that components identical to those described above are denoted by the identical reference numerals, and the description thereof will be omitted. As illustrated in FIG. 24, instead of surrounding the magnetic member 1, the power generation coil 2 may be disposed along the magnetic member 1 such that a magnetic field 62 generated by the magnetic member 1 passes through the power generation coil 2.

In the above description, a disk-shaped magnet is used as the magnetic field generation unit 11, but the magnetic field generation unit 11 is not limited thereto. As long as the external magnetic field 60 can be applied to the magnetic member 1, a shape of the magnetic field generation unit 11 can be selected according to the intended use, and may be a block shape, a rod shape, or the like. In addition, a magnet having a diameter of not less than 20 mm nor more than 22 mm is used for the magnetic field generation unit 11, but the magnet is not limited thereto, and a magnet having a diameter of less than 20 mm or a magnet having a diameter of more than 22 mm may be used.

<Effects of Power Generation Element 100>

The magnetism collection member 3 of the power generation element 100 according to the first embodiment includes the first component 33 on the opposite side of the boundary plane 32 to the magnetic field generation unit 11, and the second component 34 on the same side of the boundary plane 32 as the magnetic field generation unit 11, the boundary plane 32 being defined as the imaginary plane passing through the center 52 of the imaginary inscribed circle 51 in parallel to a virtual plane having a normal vector defined by the Z-axis direction, the inscribed circle being inscribed in the insertion part 31 and having a diameter equal to a length of the insertion part 31 in the Y-axis direction, the volume ratio of the second component 34 to the first component 33 being larger than 1. As a result, a distribution of a magnetic flux density in the region sandwiched between the magnetism collection members 3 of the magnetic member 1 that produces the large Barkhausen effect is uniform, regardless of a rotational phase of the magnetic field generation unit 11. For this reason, the large Barkhausen effect of the magnetic member 1 is likely to occur stably and simultaneously in each part of the magnetic member 1, and reversal of the magnetization direction due to the large Barkhausen effect is stabilized. That is, a size of the second component 34 that does not affect an increase in size of the power generation element 100 is changed while a size of the first component 33 that affects the increase in size of the power generation element 100 is not changed. It is therefore possible for the power generation element 100 to increase the external magnetic field 60 applied to the magnetic member 1 as well as to prevent an increase in size, as compared with the conventional one. In addition, it is possible to obtain the power generation element 100 having power generation characteristics with a small difference in rotational phase of the magnetic field generation unit 11 that generates an electromotive force with the large Barkhausen effect depending on the direction of rotation of the magnetic field generation unit 11. As a result, the electromotive force can be stably generated from the power generation coil 2 by electromagnetic induction.

Since the power generation element 100 stably generates an electromotive force, the electromotive force thus generated in the power generation element 100 is usable as power supply that drives an integrated circuit (IC).

Second Embodiment

A basic structure of the power generation element 100 according to a second embodiment is identical to that of the first embodiment, and a shape of the magnetism collection member 3 is different from that of the first embodiment. A configuration of the magnetism collection member 3 different from that of the first embodiment will be described hereinbelow.

Figure 25:
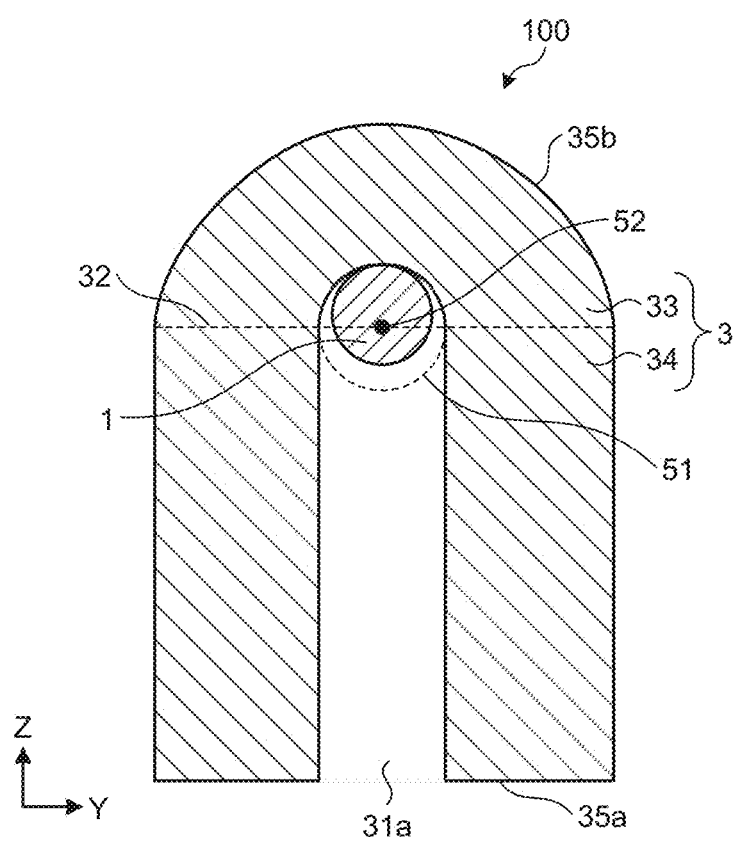
FIG. 25 is a cross-sectional view illustrating an example of a configuration of a power generation element according to a second embodiment.

FIG. 25 is a cross-sectional view illustrating an example of a configuration of the power generation element according to the second embodiment. Note that components identical to those described above are denoted by the identical reference numerals, and the description thereof will be omitted. FIG. 25 illustrates a cross section of the power generation element 100 taken at a position of the magnetism collection member 3 perpendicularly to the extending direction of the magnetic member 1.

In the structure of the magnetism collection member 3 in the first embodiment illustrated in FIGS. 1 and 2, the insertion part 31 defines a hole through the magnetism collection member 3 in the thickness direction, and the magnetic member 1 is inserted into this hole. The magnetism collection member 3 illustrated in FIG. 25 has an insertion part 31a defined by a recess extending toward the first component 33 from the surface 35a facing the magnetic field generation unit 11. That is, when viewed from the direction of extension of the magnetic member 1, the insertion part 31a has a U-shaped contour with an opened part of the surface 35a facing the magnetic field generation unit 11. Further, FIG. 25 illustrates an example in which the surface 35b of the magnetism collection member 3 on a side opposite to the surface facing the magnetic field generation unit 11 is curved.

In the magnetism collection member 3 illustrated in FIGS. 1 and 3, the hole as the insertion part 31 is formed by drilling work. The magnetism collection member 3 illustrated in FIG. 25 can be manufactured by bending work on a cold-rolled steel plate. For the power generation element 100 according to the second embodiment, therefore, production efficiency of the magnetism collection member 3 can be improved and manufacturing cost can be reduced, as compared with the case of the first embodiment.

In assembling the power generation element 100 according to the first embodiment, it is necessary to pass the magnetic member 1 through all of the power generation coil 2 and the insertion parts 31 of the two magnetism collection members 3. The magnetism collection member 3 of the power generation element 100 according to the second embodiment is opened at a part of the surface 35a facing the magnetic field generation unit 11, such that the magnetic member 1 is inserted through the power generation coil 2 alone, and placed into the recess-shaped insertion part 31a from the opened part of the surface 35a of the magnetism collection member 3 facing the magnetic field generation unit 11. As a result, it becomes possible to obtain the power generation element 100 having a stably high output, and improve the efficiency of work of inserting the magnetic member 1 into the magnetism collection member 3, as compared with the first embodiment.

Third Embodiment

A basic structure of the power generation element 100 according to a third embodiment is identical to that of the first embodiment, and a shape of the magnetism collection member 3 is different from that of the first embodiment. A configuration of the magnetism collection member 3 different from that of the first embodiment will be described hereinbelow.

Figure 26:
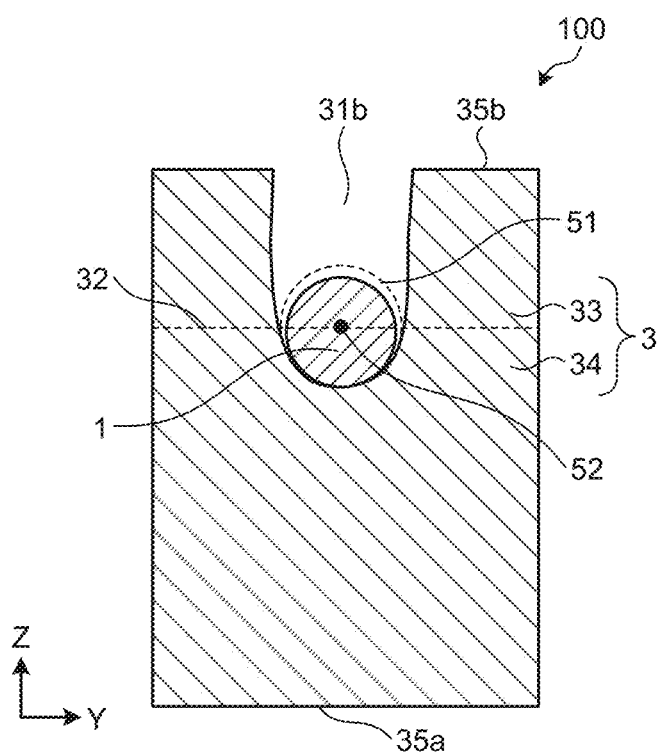
FIG. 26 is a cross-sectional view illustrating an example of a configuration of a power generation element according to a third embodiment.

FIG. 26 is a cross-sectional view illustrating an example of a configuration of the power generation element according to the third embodiment. Note that components identical to those described above are denoted by the identical reference numerals, and the description thereof will be omitted. FIG. 26 illustrates a cross section of the power generation element 100 taken at a position of the magnetism collection member 3 perpendicularly to the extending direction of the magnetic member 1.

The magnetism collection member 3 illustrated in FIG. 26 has an insertion part 31b defined by a recess extending toward the second component 34 from the surface 35b opposite to the surface 35a facing the magnetic field generation unit 11. That is, the surface 35b opposite to the surface 35a facing the magnetic field generation unit 11 has a part opened. In the first embodiment illustrated in FIG. 2, the magnetic member 1 is in contact with the inner surface of the hole defining the insertion part 31 on the side opposite to the magnetic field generation unit 11. However, in FIG. 26, the magnetic member 1 is in contact with the recess defining the insertion part 31 on the side of the magnetic field generation unit 11. The inscribed circle 51 passes through this position. Further, FIG. 26 illustrates an example in which the surface 35a of the magnetism collection member 3 facing the magnetic field generation unit 11 is flat.

The magnetism collection member 3 illustrated in FIG. 26 has the insertion part 31b formed of a rectangular parallelepiped member machined to form a groove on the surface 35b opposite to the surface 35a facing the magnetic field generation unit 11. For the power generation element 100 according to the third embodiment, therefore, the production efficiency of the magnetism collection member 3 can be improved and the manufacturing cost can be reduced as well, as compared with the case of the first embodiment.

Since the magnetism collection member 3 is opened at the part of the surface 35b opposite to the surface 35a facing the magnetic field generation unit 11, it is only required that, in assembling the power generation element 100 according to the third embodiment, the magnetic member 1 is inserted into the power generation coil 2 alone, and placed into the recess-shaped insertion part 31b from the opened part of the surface 35b of the magnetism collection member 3 on the side opposite to the surface 35a facing the magnetic field generation unit 11. As a result, in the third embodiment, it becomes possible to obtain the power generation element 100 having a stably high output, and improve the efficiency of work of inserting the magnetic member 1 into the magnetism collection member 3, as compared with the case of the first embodiment.

Fourth Embodiment

A basic structure of the power generation element 100 according to a fourth embodiment is identical to that of the first embodiment, and a shape of the magnetism collection member 3 is different from that of the first embodiment. A configuration of the magnetism collection member 3 different from that of the first embodiment will be described hereinbelow.

Figure 27:
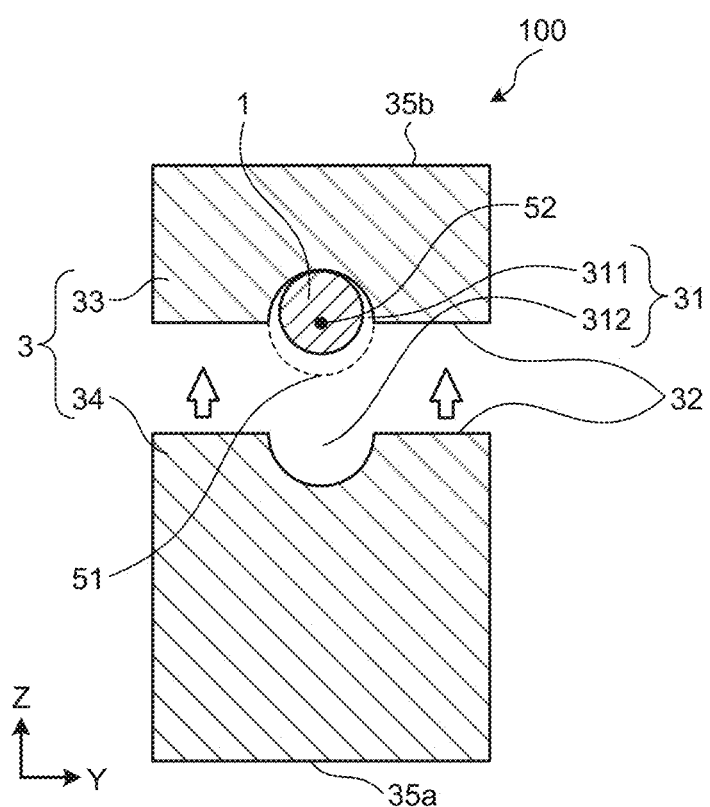
FIG. 27 is a cross-sectional view illustrating an example of a configuration of a power generation element according to a fourth embodiment.

FIG. 27 is a cross-sectional view illustrating an example of a configuration of the power generation element according to the fourth embodiment. Note that components identical to those described above are denoted by the identical reference numerals, and the description thereof will be omitted. FIG. 27 illustrates a cross section of the power generation element 100 taken at a position of the magnetism collection member 3 perpendicularly to the extending direction of the magnetic member 1.

In the magnetism collection member 3 illustrated in FIG. 27, the first component 33 and the second component 34 are separable from each other. FIG. 27 illustrates an example in which the first component 33 and the second component 34 are configured to be separable from each other at the boundary plane 32. That is, the magnetism collection member 3 includes the first component 33 made of a soft magnetic material and the second component 34 made of a soft magnetic material. A surface of the first component 33 facing the second component 34 has a recess 311 defining the insertion part 31, and a surface of the second component 34 facing the first component 33 has a recess 312 defining the insertion part 31. When the first component 33 and the second component 34 are joined together at the boundary plane 32, the two recesses 311 and 312 define the insertion part 31. Further, each of the recess 311 and 312 defines a groove on one side surface of the corresponding one of the first component 33 and the second component 34. For the power generation element 100 according to the fourth embodiment, as a result, production efficiency can be improved and manufacturing cost can be reduced, as compared with the case of the first embodiment in which the insertion part 31 is formed by drilling work. Note that, the separable magnetism collection member 3 is not limited to the configuration in which the first component 33 and the second component 34 are separated from each other at the boundary plane 32. For example, the magnetism collection member 3 may be configured to include the insertion part 31, and be separable into a member including the first component 33 and a member including the second component 34, at a plane parallel to the boundary plane 32. Further, the magnetism collection member 3, and may be configured to include the insertion part 31, and be separable into a member including the first component 33 and a member including the second component 34, at a plane parallel to the Z-axis direction.

In assembling the power generation element 100, the magnetic member 1 is passed through the power generation coil 2 and the magnetic member 1 is installed in the recess 311 of the first component 33, after which the second component 34 is brought into contact with the first component 33 to fit the recess 312 of the second component 34 to the magnetic member 1, such that the first and second components 33 and 34 are secured together. As a result, in the fourth embodiment, it becomes possible to obtain the power generation element 100 having a stably high output, and improve the efficiency of work of inserting the magnetic member 1 through the magnetism collection member 3, as compared with the case of the first embodiment.

Fifth Embodiment

A basic structure of a power generation element according to a fifth embodiment is identical to those of the first and fourth embodiments, but a structure of the magnetism collection member 3 is different from those of the first and fourth embodiments. A configuration of the magnetism collection member 3 different from those of the first and fourth embodiments will be described hereinbelow.

Figure 28:
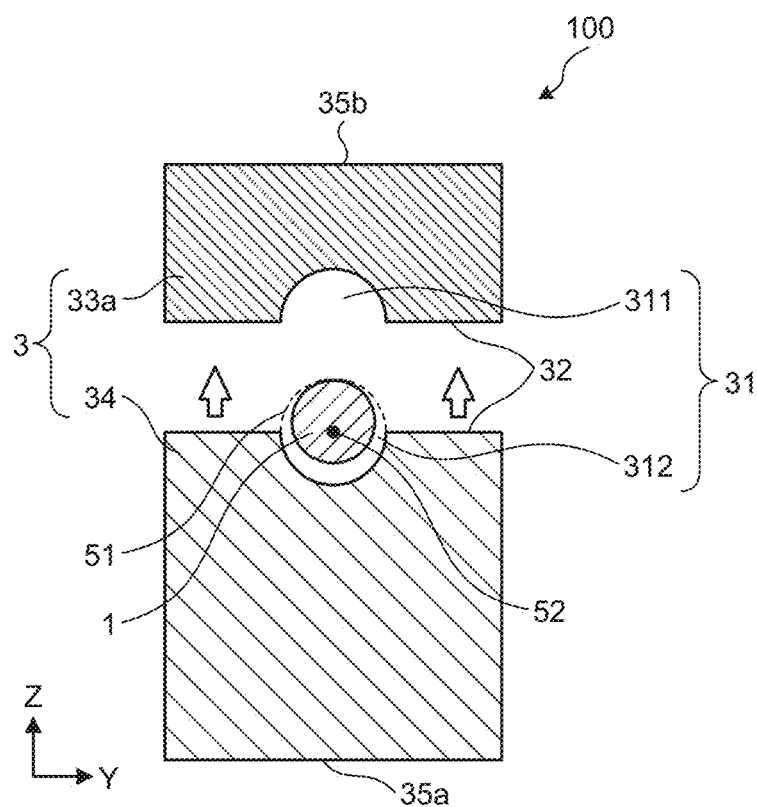
FIG. 28 is a cross-sectional view illustrating an example of a configuration of a power generation element according to a fifth embodiment.

FIG. 28 is a cross-sectional view illustrating an example of a configuration of the power generation element according to the fifth embodiment. Note that components identical to those described above are denoted by the identical reference numerals, and the description thereof will be omitted. FIG. 28 illustrates a cross section of the power generation element 100 taken at a position of the magnetism collection member 3 perpendicularly to the extending direction of the magnetic member 1.

The magnetism collection member 3 has a first component 33a and the second component 34 that are separable from each other at the boundary plane 32. The fifth embodiment differs from the fourth embodiment in that the second component 34 is made of a soft magnetic material, but the first component 33a is made of a non-magnetic material. That is, the magnetism collection member 3 does not need to be entirely made of a soft magnetic material, and the magnetism collection member 3 only needs to contain a soft magnetic material. However, in order to allow the magnetic flux 61 from the magnetic field generation unit 11 to pass through the magnetic member 1 via one magnetism collection member 3 and return from the other magnetism collection member 3 to the magnetic field generation unit 11, at least the second component 34 of the magnetism collection member 3 is made of a soft magnetic material. When the first component 33a is made of a non-magnetic material and the second component 34 is made of a soft magnetic material, as discussed above, the uniformity of a magnetic flux density in the magnetic member 1 can be achieved as in the first and fourth embodiments. Note that, other configurations are similarly to those of the first and fourth embodiments.

An effect similar to that of the fourth embodiment can also be obtained by the fifth embodiment.

Sixth Embodiment

In the first to fifth embodiments, the power generation element 100 has been described as including one unit structure part 101. In a sixth embodiment, the power generation element 100 will be described as having a plurality of unit structure parts 101 disposed adjacent to each other.

Figure 29:
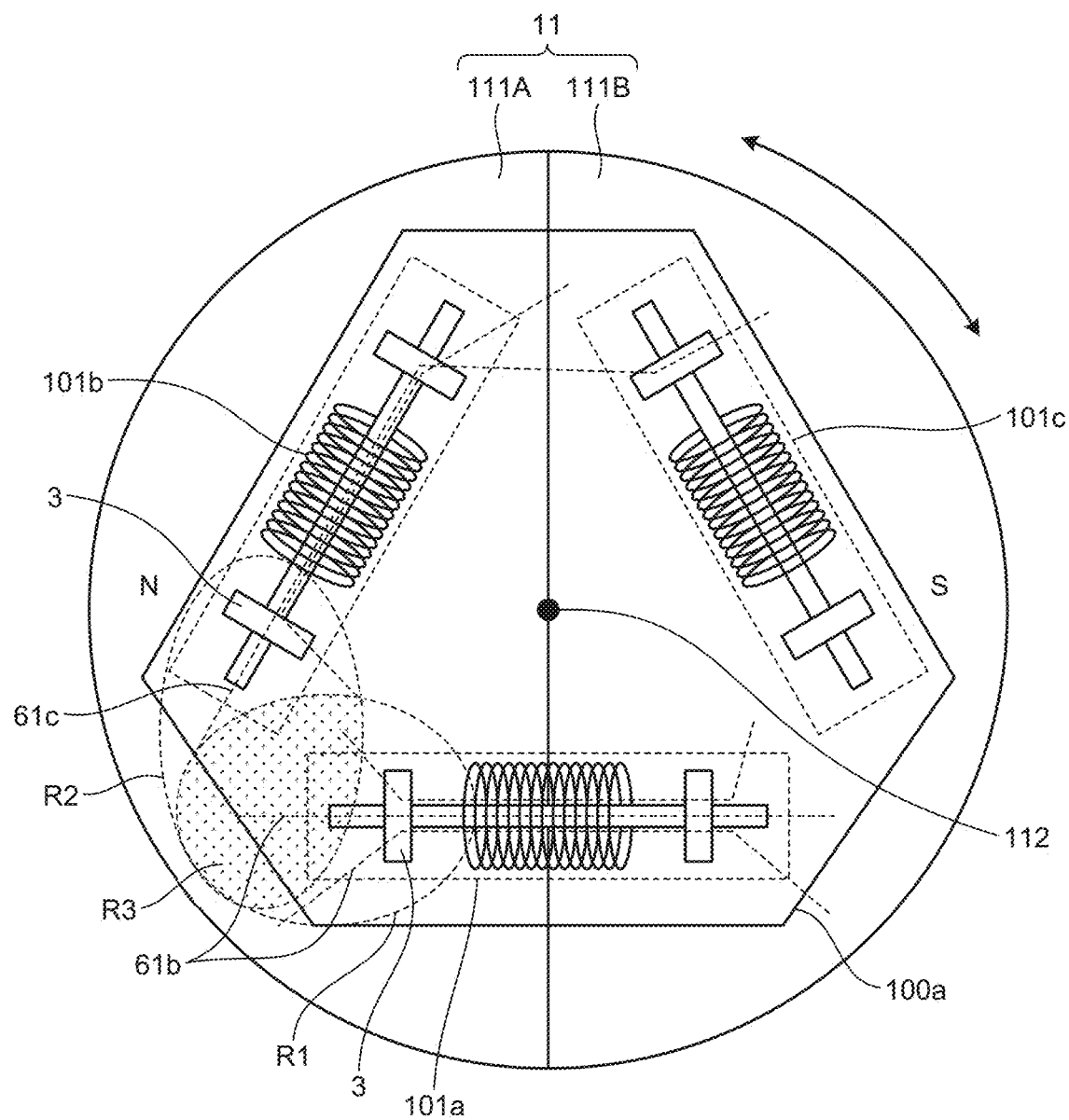
FIG. 29 is a top view illustrating an example of a configuration of a power generation element according to a sixth embodiment.

FIG. 29 is a top view illustrating an example of a configuration of a power generation element according to the sixth embodiment. Note that components identical to those described above are denoted by the identical reference numerals, and the description thereof will be omitted. In the sixth embodiment, a power generation element 100a includes three unit structure parts 101a, 101b, and 101c. The three unit structure parts 101a, 101b, and 101c are arranged adjacent to each other in the shape of an equilateral triangle above the magnetic field generation unit 11. A line segment extending from the rotation center 112 of the magnetic field generation unit 11 to a midpoint of each of the unit structure parts 101a, 101b, and 101c in the direction of extension of the magnetic member 1 is 120 degrees away from an adjacent line segment.

A description will be made as to a magnetic flux when the unit structure parts 101a, 101b, and 101c are arranged as illustrated in FIG. 29. A description will be first made as to the unit structure parts 101a, 101b, and 101c that are not those disclosed in the first to fifth embodiments, but have structures including conventional magnetism collection members 3 as illustrated in FIG. 7.

Figure 30:
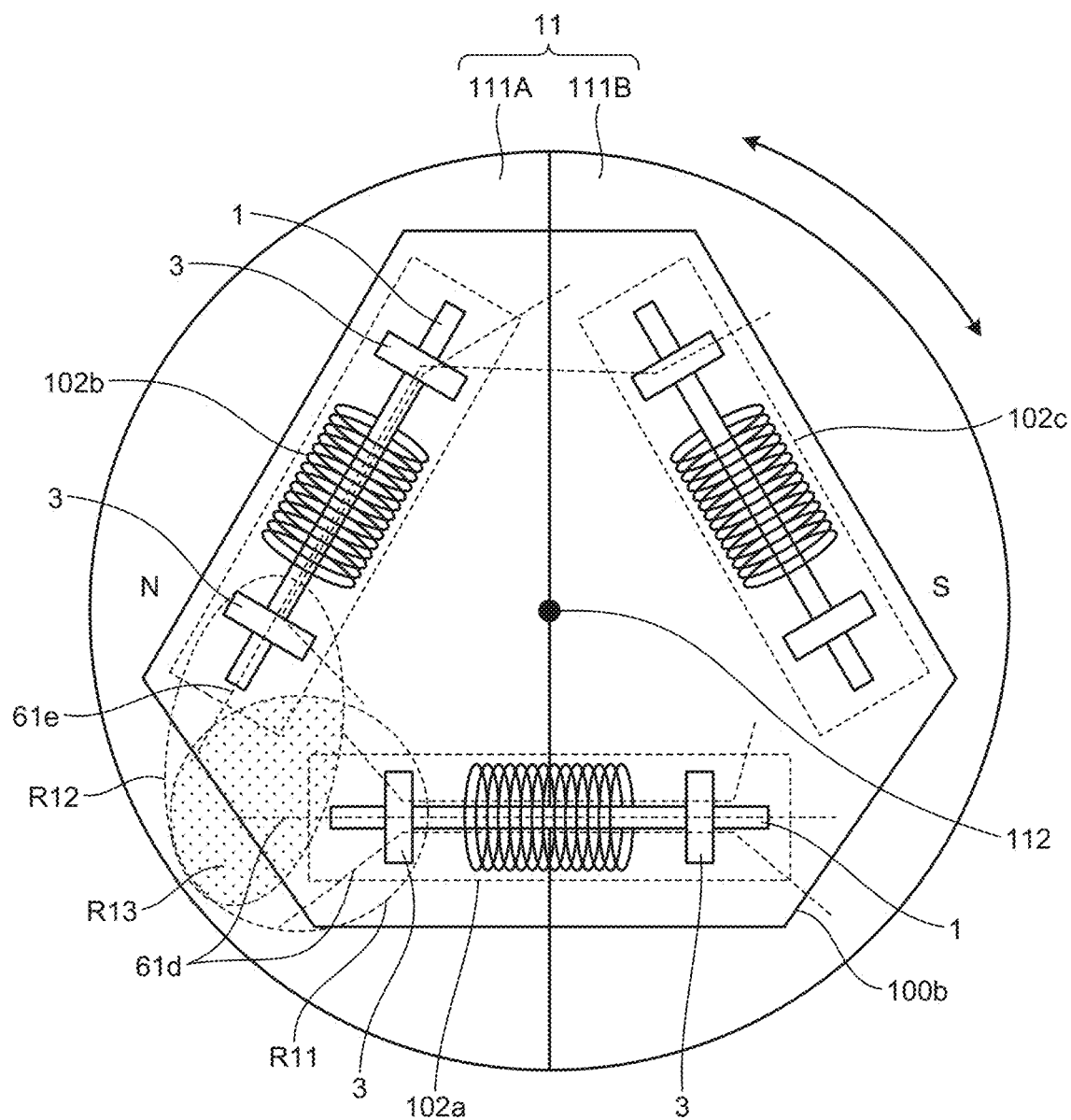
FIG. 30 is a view schematically illustrating a flow of a magnetic flux in the power generation element including the conventional magnetism collection member.

FIG. 30 is a view schematically illustrating a flow of a magnetic flux in a power generation element including a conventional magnetism collection member. Similarly to FIG. 29, a power generation element 100b of FIG. 30 has three unit structure parts 102a, 102b, and 102c arranged adjacent to each other in the shape of an equilateral triangle. Further, a volume ratio of the magnetism collection member 3 is 1.

Let us consider a situation where the unit structure part 102a alone is present in FIG. 30. In this case, a magnetic flux 61d output from a region R11 of the magnetic field generation unit 11 passes through the magnetic member 1 via the one magnetism collection member 3 of the unit structure part 102a, then through the opposite magnetism collection member 3, after which the magnetic flux 61d flows toward the magnetic field generation unit 11. The region R11 is defined as a region where the magnetism collection member 3 of the unit structure part 102a can collect magnetism.

Next, let us consider the power generation element 100b having a structure including a plurality of unit structure parts 102a, 102b, and 102c arranged adjacent to each other, as illustrated in FIG. 30. In particular, let us consider the unit structure part 102a and the unit structure part 102b. As in the case where the unit structure part 102a alone is present, the magnetic flux 61d from the region R11 of the magnetic field generation unit 11 passes through the magnetic member 1 via the one magnetism collection member 3 of the unit structure part 102a, then through the opposite magnetism collection member 3, after which the magnetic flux 61d flows toward the magnetic field generation unit 11. Further, a magnetic flux 61e from a region R12 of the magnetic field generation unit 11 passes through the magnetic member 1 via the one magnetism collection member 3 of the unit structure part 102b, passes through the opposite magnetism collection member 3, after which the magnetic flux 61e flows toward the magnetic field generation unit 11. The magnetic fluxes 61d and 61e output from a region R13 where the regions R11 and R12 overlap may pass through the magnetism collection member 3 of the unit structure part 102a or may pass through the magnetism collection member 3 of the unit structure part 102b. That is, the magnetic fluxes 61d and 61e from the region R13 pass through the unit structure part 102a in the presence of the unit structure part 102a alone, but, in the presence of the unit structure part 102a and the unit structure part 102b, some of the magnetic fluxes 61d and 61e passes through one of the unit structure part 102a and the remaining magnetic fluxes pass through the other unit structure part. For this reason, the arrangement of the unit structure parts 102a, 102b, and 102c using the conventional magnetism collection member 3 illustrated in FIG. 7 poses a problem of decreased uniformity of the magnetic flux density as the magnetic flux 61d passing through the magnetic member 1 of the unit structure part 102a is reduced and a difference in rotational phase of the magnetic field generation unit 11 increases, as compared with a case where the unit structure part 102a alone is used.

Using the unit structure parts 101a, 101b, and 101c including the magnetism collection members 3 in which the volume ratio of the second component 34 to the first component 33 is larger than 1, as illustrated in FIG. 6, FIG. 18, or FIG. 19, allows the magnetism collection member 3 to be so close to the magnetic field generation unit 11 as to actively collect the magnetic flux 61d output from the magnetic field generation unit 11. As illustrated in FIG. 29, the magnetism collection member 3 of the unit structure part 101a can collect a magnetic flux 61b from a region R1, and the magnetism collection member 3 of the unit structure part 101b can collect a magnetic flux 61c from a region R2. Although the magnetic fluxes 61b and 61c from a region R3 where the region R1 the region R2 overlap are collected to the magnetism collection members 3 of the unit structure part 101a and the unit structure part 101b as described above, the region R1 having the region R3 excluded is larger than the region R11 having the region R13 excluded in FIG. 30, because the volume ratio of the magnetism collection members 3 is larger. That is, although the unit structure part 101a shares the magnetic flux 61c in the region R3 with the adjacent unit structure part 101b, the magnetism collection member 3 of the unit structure part 101a can also collect the magnetic flux 61b from the region R1 having the region R3 excluded. As a result, it becomes possible for the magnetism collection member 3 of the unit structure part 101a to compensate for the shortage of the magnetic flux 61b due to the collection by another unit structure part 101b. Note that, here, the unit structure part 101a has been discussed by way of example, but the same applies to the other unit structure parts 101b and 101c.

Further, in a case where the power generation element 100a includes the three unit structure parts 101a, 101b, and 101c, as illustrated in FIG. 29, the volume ratio of the magnetism collection member 3 is preferably increased as compared with the case of using only one unit structure part 101 as in the first to fifth embodiments. In that case, it is noted that the first components 33 of the magnetism collection members 3 have the same volumes. Increasing the volume ratio of the magnetism collection member 3 makes it possible to collect the magnetic flux 61b as in the case of using only one unit structure part 101. In a case where the power generation element 100a includes the three unit structure parts 101a, 101b, and 101c as illustrated in FIG. 29, the volume ratio, which is up to 4, can be increased not less than 0.05 nor more than 0.25. That is, a volume ratio of the second component 34 to the first component 33 is more than 1.05 but 4 or less, and more preferably between 1.35 and 2.85, inclusive, as compared with the case where the power generation element 100 has one unit structure part 101.

The above description has been made as to the power generation element 100a having the unit structure parts 101a, 101b, and 101c arranged in the shape of an equilateral triangle, but the power generation element 100a may include a plurality of unit structure parts 101 arranged in any shape.

In the sixth embodiment, the power generation element 100 includes a plurality of unit structure parts 101 of the first to fifth embodiments. Further, the unit structure part 101 uses the magnetism collection member 3 having a volume ratio of more than 1.05 but 4 or less. This makes it possible to increase the magnetism collecting effect and compensate for the magnetic flux 61e absorbed by the adjacent unit structure part 101. As illustrated in FIG. 4, therefore, the large Barkhausen effect occurs at the rotational phase of θ2 smaller than θ1 with an inter-pole of the magnetic field generation unit 11 as a boundary when the magnetic field generation unit 11 rotates clockwise, and the large Barkhausen effect occurs at −θ2 with the inter-pole of the magnetic field generation unit 11 as a boundary when the magnetic field generation unit 11 rotates counterclockwise. In this way, the different directions of rotation of the magnetic field generation unit 11 causes the smaller difference 2θ2 in the rotational phase of the magnetic field generation unit 11 at which phase to produce the large Barkhausen effect than the rotational phase difference 2θ1 of the unit structure part 101 using the conventional magnetism collection member 3, thereby reducing the difference in the rotational phase of the magnetic field generation unit 11 that generates the electromotive force. In addition, a distribution of a magnetic flux density in the region sandwiched between the magnetism collection members 3 of the magnetic member 1 that produces the large Barkhausen effect is uniform. For this reason, the large Barkhausen effect of the magnetic member 1 is likely to occur stably in each part of the magnetic member 1, and reversal of the magnetization direction due to the large Barkhausen effect is stabilized. That is, a size of the first component 33 of each of the unit structure parts 101a, 101b, and 101c that affects an increase in size of the power generation element 100 is changed while a size of the second component 34 of each of the unit structure parts 101a, 101b, and 101c that does not affect an increase in size of the power generation element 100 is not changed. It is therefore possible for the power generation element 100 to increase the external magnetic field 60 applied to the magnetic member 1 as well as to prevent an increase in size as compared with the conventional one. In addition, it is possible to obtain the power generation element 100 having power generation characteristics with a small difference in rotational phase of the magnetic field generation unit 11 that generates an electromotive force with the large Barkhausen effect depending on the rotation direction of the magnetic field generation unit 11. As a result, the electromotive force can be stably generated from the power generation coil 2 by electromagnetic induction.

Since the power generation element 100 stably generates an electromotive force, the electromotive force thus generated in the power generation element 100 is usable as power supply that drives an IC.

Seventh Embodiment

In a seventh embodiment, a case will be described in which the power generation element 100 described in the first to sixth embodiments is applied to a magnetic sensor.

Figure 31:
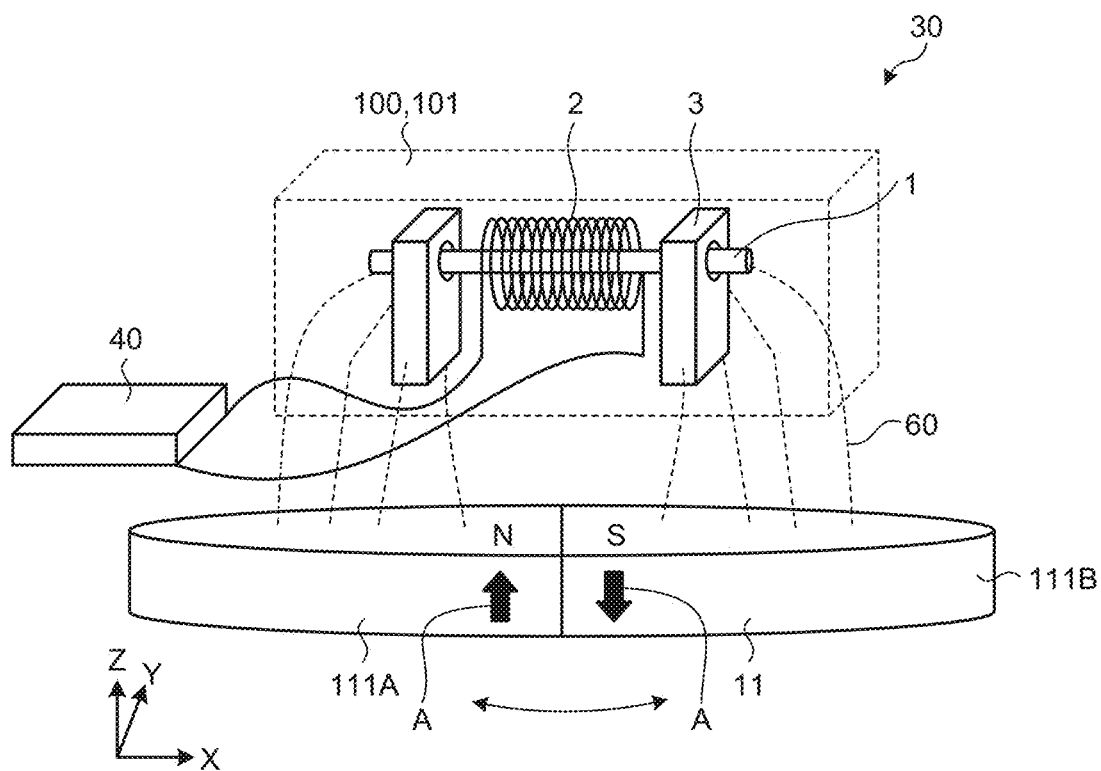
FIG. 31 is a perspective view schematically illustrating an example of a configuration of a magnetic sensor according to a seventh embodiment.

FIG. 31 is a perspective view schematically illustrating an example of a configuration of the magnetic sensor according to the seventh embodiment. A magnetic sensor 30 includes the power generation element 100 and a control unit 40. In FIG. 31, the power generation element 100 described in the first embodiment is used, but the power generation element 100 described in the second to fifth embodiments may be used. The magnetic sensor 30 detects a fluctuating external magnetic field 60 generated by the magnetic field generation unit 11. The magnetic field generation unit 11 applies the external magnetic field 60 to the power generation element 100. The magnetic field generation unit 11 is a disk-shaped magnet similar to that illustrated in FIG. 1. The magnetic field generation unit 11 has a surface facing the power generation element 100, one half of the surface defines an N pole, and the other half defines an S pole. The magnetic field generation unit 11 is rotatable about the Z axis passing through the center. The control unit 40 is connected to the power generation coil 2 of the power generation element 100, and detects fluctuation of the external magnetic field 60 by detecting an induced electromotive force generated by the power generation coil 2. The control unit 40 is made of an IC, for example.

Rotation of the magnetic field generation unit 11 applies the external magnetic field 60 uniformly to the magnetic member 1 throughout a region between the magnetism collection members 3 of the power generation element 100, such that the magnetic flux density in the magnetic member 1 is uniform regardless of a position of the magnetic member 1 in the direction of extension of the magnetic member 1. That is, the magnetic flux density in the magnetic member 1 is uniformly distributed in the direction of extension of the magnetic member 1 becomes uniform. Then, when the magnetic flux density becomes greater than or equal to a predetermined threshold value, the magnetic flux is reversed by the large Barkhausen effect. As described above, since the magnetic flux density in the magnetic member 1 is uniform throughout the region sandwiched between the magnetism collection members 3, the reversal of the magnetic flux becomes steep. As a result, a voltage generated from the power generation coil 2 by electromagnetic induction becomes a pulse shape. This voltage having a pulse shape is detected by the control unit 40.

Note that FIG. 31 illustrates the magnetic sensor 30 including the power generation element 100 having one unit structure part 101. However, the power generation element 100 of the magnetic sensor 30 may have two or more unit structure parts 101. In one example, as illustrated in FIG. 29, the power generation element 100a including the three unit structure parts 101a, 101b, and 101c may be used. In this case, the three unit structure parts 101a, 101b, and 101c arranged in the shape of an equilateral triangle define one package.

Figure 32:
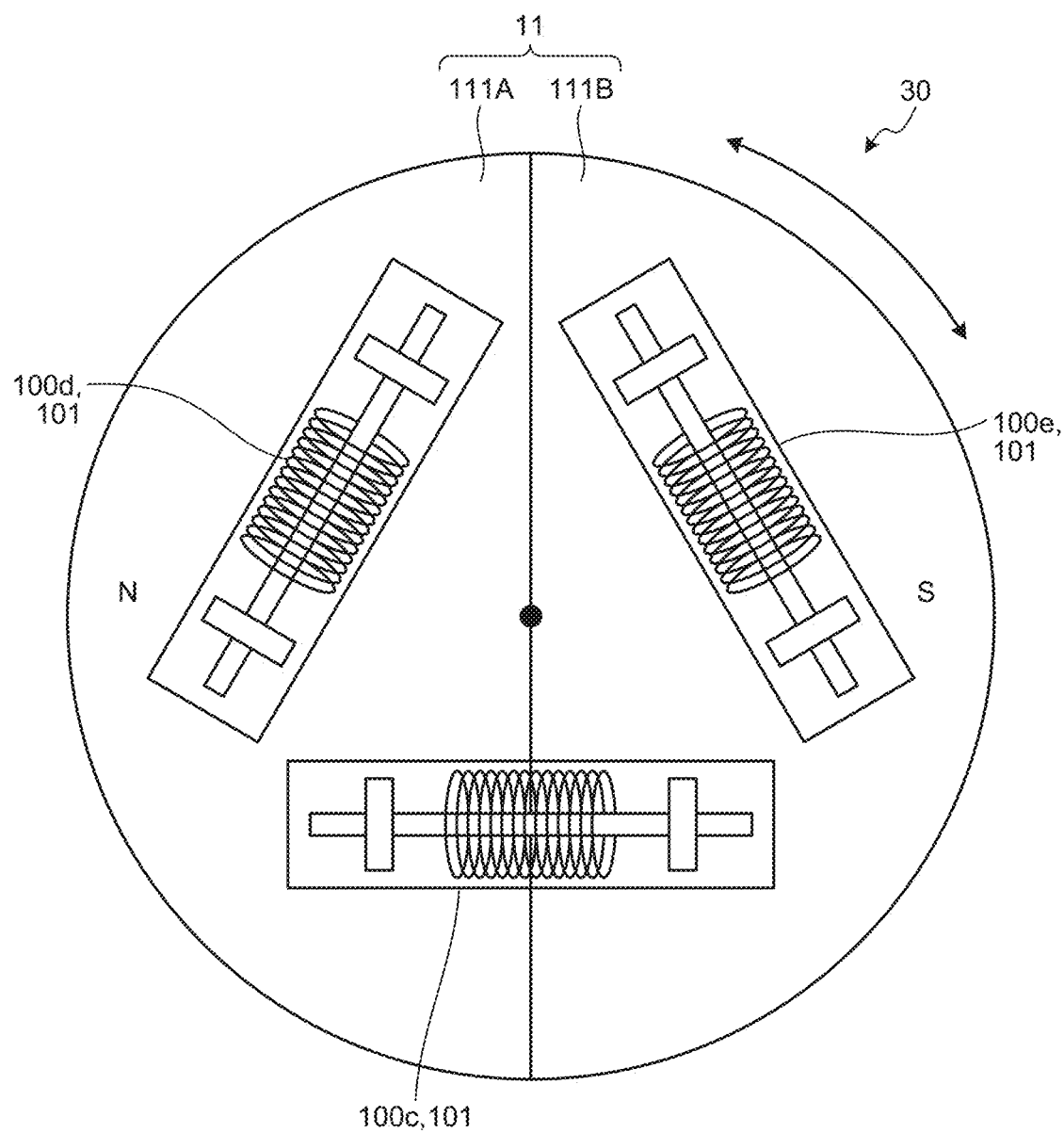
FIG. 32 is a top view schematically illustrating another example of a configuration of the magnetic sensor according to the seventh embodiment.

FIG. 32 is a top view schematically illustrating another example of a configuration of the magnetic sensor according to the seventh embodiment. Note that, FIG. 32 omits the illustration of the control unit 40. Further, components identical to those described above are denoted by the identical reference numerals, and the description thereof will be omitted. In FIG. 32, the magnetic sensor 30 includes three power generation elements 100c, 100d, and 100e. Each of the power generation elements 100c, 100d, and 100e includes one unit structure part 101. Further, each of the power generation elements 100c, 100d, and 100e defines one package. In this way, the magnetic sensor 30 may be configured such that the packaged plurality of power generation elements 100c, 100d, and 100e each including one unit structure part 101 are arranged, or that one packaged power generation element 100a including a plurality of unit structure parts 101a, 101b, 101c is disposed as illustrated in FIG. 29.

The magnetic sensor 30 of the seventh embodiment includes the power generation element 100 described in the first to sixth embodiments, and the control unit 40. In the power generation element 100, the magnetic flux density in the magnetic member 1 is uniform throughout the region sandwiched between the magnetism collection members 3. As a result, reversal of the magnetic flux becomes steep, such that a voltage generated in the power generation coil 2 becomes a pulse shape. The control unit 40 detects this pulse-shaped voltage, thereby allowing the magnetic sensor 30 to determine the fluctuation of the external magnetic field 60. In addition, the control unit 40 is operated by the electromotive force generated by the external magnetic field 60 changed by rotation of the magnetic field generation unit 11. This makes it possible to provide the magnetic sensor 30 with high reliability without power supply.

Eighth Embodiment

In an eighth embodiment, a description will be made as to the application of the power generation element 100 described in the first to fifth embodiments to an encoder. A reflective optical encoder will be hereinbelow discussed as an example of the encoder.

Figure 33:
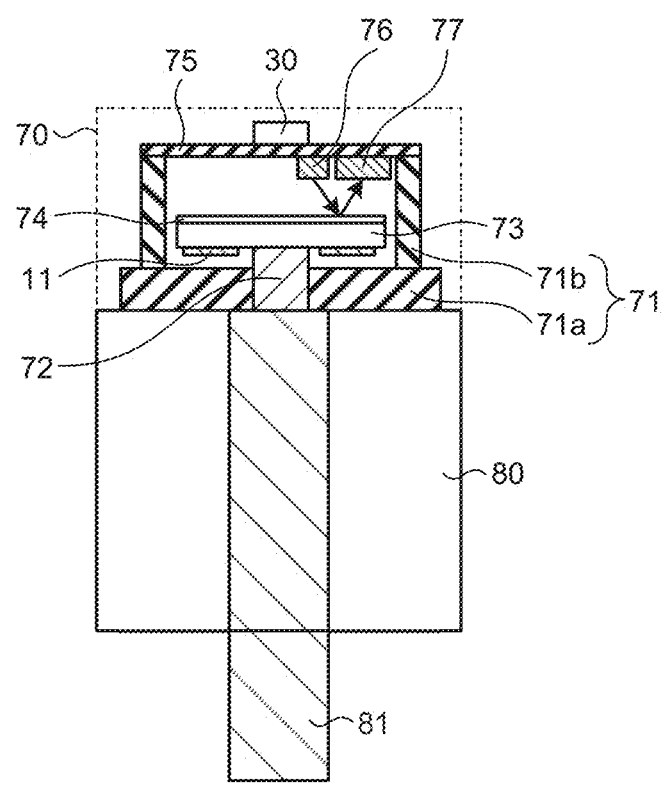
FIG. 33 is a cross-sectional view schematically illustrating an example of a configuration of a reflective optical encoder according to an eighth embodiment.

FIG. 33 is a cross-sectional view schematically illustrating an example of a configuration of a reflective optical encoder according to the eighth embodiment. FIG. 33 illustrates an example in which a motor 80 includes a reflective optical encoder 70. That is, FIG. 33 illustrates an example in which the reflective optical encoder 70 is attached to the motor 80. The reflective optical encoder 70 includes a housing 71, a rotary shaft 72, a hub member 73, a scale plate 74, the magnetic field generation unit 11, a substrate 75, a light projection unit 76, a light reception unit 77, and the magnetic sensor 30 which is a non-power supply sensor.

The housing 71 is a member that covers components of the reflective optical encoder 70. In FIG. 33, the housing 71 has a tubular shape having one opened bottom. The housing 71 includes a first housing 71a defining the bottom surface of the tubular shape and a second housing 71b defining a literal side of the tubular shape. The first housing 71a is provided in contact with the motor 80. The literal side of the second housing 71b extends in a direction parallel to a direction of extension of a motor rotation shaft 81 of the motor 80, surrounding the components of the reflective optical encoder 70.

The rotary shaft 72 has one end portion connected to the motor rotation shaft 81 of the motor 80. The rotary shaft 72 is disposed extending through the first housing 71a. The hub member 73 is a disk-shaped member secured to the opposite end portion of the rotary shaft 72, and rotates with rotation of the rotary shaft 72. The scale plate 74 has an optical pattern for detection of a rotation angle. The scale plate 74 has a disk shape and is attached to the hub member 73. The optical pattern includes a high reflection part having a high light reflectance and a low reflection part having a low light reflectance, and is provided on an opposite surface of the scale plate 74 to a surface of the scale plate 74 to which the hub member 73 is attached. The magnetic field generation unit 11 is a plurality of magnets attached to an opposite surface of the hub member 73 to a surface of the hub member 73 to which the scale plate 74 is attached. In one example, the magnetic field generation unit 11 includes two magnets having different magnetic poles on the surface attached to the hub member 73.

The substrate 75 is a plate-shaped member that covers an opening of the housing 71 and supports some of members of the reflective optical encoder 70. The light projection unit 76 and the light reception unit 77 are provided on a surface of the substrate 75 facing the scale plate 74. The light projection unit 76 is a light emitting element that irradiates the scale plate 74 with light. The light reception unit 77 is a light receiving element that receives light reflected by the optical pattern of the scale plate 74. An example of the light projection unit 76 is a laser diode or a light emitting diode, and an example of the light reception unit 77 is a photodiode.

The magnetic sensor 30 is provided on an opposite surface of the substrate 75 to the surface of the substrate 75 facing the scale plate 74. The magnetic sensor 30 illustrated in FIG. 31, which is used as a non-power supply sensor, is a combination of the control unit 40 and the power generation element 100 that has characteristics of stably supplying power and outputting pulse. Since the configuration of the magnetic sensor 30 has been described in the seventh embodiment, the description thereof will be omitted.

As described above, the hub member 73, the scale plate 74, the magnetic field generation unit 11, the light projection unit 76, and the light reception unit 77 are surrounded by the housing 71 and the substrate 75.

In the reflective optical encoder 70, when the rotary shaft 72 rotates, light is emitted from the light projection unit 76, and an amount change of reflected light, which is light reflected by the optical pattern on the scale plate 74, is detected by the light reception unit 77. This allows the detection of a rotation angle and a rotation speed. In addition, the power generation element 100 generates power by a change in direction of a magnetic force emitted from the magnetic field generation unit 11 with rotation of the hub member 73. This allows the detection of the number of rotations from a reference position. The rotary shaft 72 is connected to the motor rotation shaft 81 of the motor 80, and rotates with rotation of the motor rotation shaft 81. The reflective optical encoder 70 can therefore detect a rotation angle, a number of rotations, and a rotation speed, of the motor 80 by detecting the rotation angle, the rotation speed, and the rotation speed, of the rotary shaft 72.

Note that FIG. 33 illustrates the magnetic field generation unit 11 provided on the side opposite to the surface of the hub member 73 to which the scale plate 74 is attached, but the magnetic field generation unit 11 may be provided between the hub member 73 and the scale plate 74. In this case, a step of securing the hub member 73 and the magnetic field generation unit 11 together can be omitted, thereby improving production efficiency. Furthermore, the hub member 73 may be the magnetic field generation unit 11. Since the magnetic field generation unit 11 has the function of the hub member 73, the number of components of the reflective optical encoder 70 can be reduced, and production efficiency can be improved. In this case, a material in which magnetic particles are dispersed in a plastic material or the like can be used as a material of the hub member 73. By using this material, it becomes possible to mold various shapes of the hub member 73 by injection molding. Further, the hub member 73 is not limited to being formed by dispersing magnetic particles in a plastic material or the like, and may be formed of a ferrite magnet, an alnico magnet, or a rare earth magnet material.

Since the reflective optical encoder 70 according to the eighth embodiment includes the magnetic sensor 30 described in the seventh embodiment as a non-power supply sensor, it is possible to provide a highly reliable encoder without power supply. Further, although the reflective optical encoder 70 has been described by way of example, any encoder including the magnetic sensor 30 can employ the power generation elements 100 described in the first to fifth embodiments can be applied, and provide effects similar to those of the reflective optical encoder 70.

The configurations illustrated in the above embodiments illustrate one example and can be combined with another known technique, and it is also possible to combine embodiments with each other and omit and change a part of the configuration without departing from the subject matter of the present disclosure.

REFERENCE SIGNS LIST

1, 1A magnetic member; 2 power generation coil; 3 magnetism collection member; 11 magnetic field generation unit; 15 terminal; 21 terminal wire; 30 magnetic sensor; 31, 31*a*, 31*b* insertion part; 32 boundary plane; 33, 33*a* first component; 34 second component; 40 control unit; 51 inscribed circle; 52 center; 60 external magnetic field; 61, 61*a*, 61*b*, 61*c*, 61*d*, 61*e* magnetic flux; 62 magnetic field; 70 reflective optical encoder; 71 housing; 71*a* first housing; 71*b* second housing; 72 rotary shaft; 73 hub member; 74 scale plate; 75 substrate; 76 light projection unit; 77 light reception unit; 80 motor; 81 motor rotation shaft; 100, 100*a*, 100*b*, 100*c*, 100*d*, 100*e* power generation element; 101, 101*a*, 101*b*, 101*c*, 102*a*, 102*b*, 102*c* unit structure part; 111A, 111B magnet component; 112 rotation center; 311, 312 recess.

The invention claimed is:

1. A power generation element comprising:
a magnetic member made of a magnetic material to produce a large Barkhausen effect;
a power generation coil to interlink with a magnetic flux passing through the magnetic member; and
two magnetism collectors containing a soft magnetic material and each including an insertion part having the magnetic member inserted therethrough, the magnetism collectors being provided at opposite end portions of the magnetic member in contact with the magnetic member with the magnetic member inserted through the insertion parts, wherein
the magnetism collector includes a first component on an opposite side of a boundary plane to a magnetic field and a second component on the same side of the boundary plane as the magnetic field generator, the boundary plane being defined as an imaginary plane passing through a center of an imaginary inscribed circle, the imaginary inscribed circle being inscribed in the insertion part and having a diameter equal to a length of the insertion part in a third direction, the third direction being a direction perpendicular to both a first direction and a second direction, the imaginary plane being parallel to an imaginary plane having a normal vector defined by the second direction, the first direction being a direction in which the magnetic member is inserted in the insertion part, the second direction being a direction in which the magnetic field generator to apply a magnetic field to the magnetic member is disposed as viewed from the magnetism collector, and
a volume of the second component is larger than a volume of the first component.

2. The power generation element according to claim 1, wherein the power generation coil is wound around the magnetic member.

3. The power generation element according to claim 1, wherein the power generation coil is disposed along the magnetic member.

4. The power generation element according to claim 1, wherein the magnetic member has a linear shape.

5. The power generation element according to claim 1, wherein the magnetism collector is in contact with the magnetic member at a portion of the insertion part, which portion is opposite to a location where the magnetic field generator is disposed.

6. The power generation element according to claim 1, wherein the magnetism collector has a flat surface facing the magnetic field generator.

7. The power generation element according to claim 1, wherein the magnetism collector has a curved surface facing the magnetic field generator.

8. The power generation element according to claim 1, wherein the insertion part is a hole extending through the magnetism collector.

9. The power generation element according to claim 1, wherein the insertion part is a recess extending toward the first component from a surface of the magnetism collector facing the magnetic field generator.

10. The power generation element according to claim 1, wherein the magnetism collector one surface facing the magnetic field generator and an opposite surface located opposite the one surface, the magnetism collector being recessed from the opposite surface toward the second component.

11. The power generation element according to claim 1, wherein the magnetism collector is separable into a member including the first component and a member including the second component.

12. The power generation element according to claim 11, wherein the first component and the second component are made of soft magnetic materials.

13. The power generation element according to claim 11, wherein
the first component is made of a non-magnetic material, and
the second component is made of a soft magnetic material.

14. The power generation element according to claim 1, wherein the magnetism collector is formed of a cold-rolled steel plate.

15. The power generation element according to claim 1, wherein the soft magnetic material is a material selected from a group consisting of soft ferrite, permalloy, permendur, silicon steel, amorphous magnetic alloy, nanocrystal magnetic alloy, and sendust.

16. A magnetic sensor comprising:
the power generation element according to claim 1; and
the magnetic field generator.

17. The magnetic sensor according to claim 16, wherein a magnetization direction of the magnetic field generator is a direction intersecting a surface of the magnetic field generator facing the power generation element.

18. An encoder comprising:
the power generation element according to claim 1; and
the magnetic field generator.

19. A motor comprising the encoder according to claim 18.

* * * * *